(12) United States Patent
Fortier et al.

(10) Patent No.: US 12,101,095 B2
(45) Date of Patent: Sep. 24, 2024

(54) FRACTIONAL DIVIDER WITH DUTY CYCLE REGULATION AND LOW SUBHARMONIC CONTENT

(71) Applicant: Analog Devices International Unlimited Company, Limerick (IE)

(72) Inventors: Justin L. Fortier, Ontario (CA); Benjamin Philip Walker, Arlington, MA (US)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 18/317,582

(22) Filed: May 15, 2023

(65) Prior Publication Data

US 2023/0336182 A1    Oct. 19, 2023

Related U.S. Application Data

(63) Continuation of application No. 17/723,251, filed on Apr. 18, 2022, now Pat. No. 11,652,489.

(51) Int. Cl.
| | |
|---|---|
| *H03L 7/197* | (2006.01) |
| *H03L 7/085* | (2006.01) |
| *H03L 7/185* | (2006.01) |

(52) U.S. Cl.
CPC ............ *H03L 7/1974* (2013.01); *H03L 7/085* (2013.01); *H03L 7/185* (2013.01)

(58) Field of Classification Search
CPC ........ H03L 7/1974; H03L 7/085; H03L 7/185
See application file for complete search history.

(56) References Cited

U.S. PATENT DOCUMENTS 4,672,329 A * 6/1987 Hikawa .................. H04L 7/033
331/25
7,839,195 B1 * 11/2010 Feng ...................... H03K 5/156
327/147

(Continued)

FOREIGN PATENT DOCUMENTS

CN    104320131 A  *  1/2015
CN    105262481 A  *  1/2016

(Continued)

OTHER PUBLICATIONS

Chu et al., "Duty-Cycle Correction for a Super-Wide Frequency Range from 10MHz to 1.2 GHz," IEEE 38th International Conference on Computer Design (ICCD), Dec. 21, 2020, pp. 457-460.

(Continued)

*Primary Examiner* — Adam D Houston
(74) *Attorney, Agent, or Firm* — ARENTFOX SCHIFF LLP

(57) ABSTRACT

Systems, devices, and methods related to frequency divider circuitry are provided. An apparatus includes frequency divider circuitry including a first node to receive an input signal; fractional divider circuitry to generate, based on the input signal and a frequency-division ratio, a first signal having a first series of pulses with adjacent pulses triggered by opposite edges of the input signal, wherein the fractional divider circuitry includes first signal selection circuitry; balancer divider circuitry to generate, based on the input signal, a second signal having a second series of pulses aligned to the first series of pulses, wherein the balancer divider circuitry includes second signal selection circuitry triggered by opposite edges of the input signal than the first signal selection circuitry; and a second node to combine the first signal and the second signal.

20 Claims, 11 Drawing Sheets

(56) References Cited

U.S. PATENT DOCUMENTS

| | | | | |
|---|---|---|---|---|
| 10,063,145 B1* | 8/2018 | Couleur | | H02M 3/158 |
| 11,277,140 B1* | 3/2022 | Park | | H03L 7/091 |
| 11,652,489 B1* | 5/2023 | Fortier | | H03L 7/085 |
| | | | | 327/156 |
| 2002/0030546 A1* | 3/2002 | Keating | | H03L 7/185 |
| | | | | 331/25 |
| 2002/0140477 A1* | 10/2002 | Zhou | | H03K 5/1565 |
| | | | | 327/175 |
| 2006/0176783 A1* | 8/2006 | Sergey | | G11B 7/0053 |
| | | | | 369/47.1 |
| 2006/0202669 A1* | 9/2006 | Nishimori | | H02M 3/1588 |
| | | | | 323/283 |
| 2007/0041476 A1* | 2/2007 | Seon | | H04L 27/04 |
| | | | | 340/10.2 |
| 2009/0160430 A1* | 6/2009 | Brown | | H01P 1/2135 |
| | | | | 324/76.23 |
| 2011/0109354 A1* | 5/2011 | Feng | | H03K 5/156 |
| | | | | 327/156 |
| 2011/0292290 A1* | 12/2011 | Aizawa | | H03D 7/165 |
| | | | | 348/E5.077 |
| 2012/0161829 A1* | 6/2012 | Fernald | | H03L 7/085 |
| | | | | 327/156 |
| 2012/0161835 A1* | 6/2012 | David | | H03L 7/146 |
| | | | | 327/157 |
| 2013/0009683 A1* | 1/2013 | Ichida | | H03L 7/085 |
| | | | | 327/158 |
| 2021/0335403 A1* | 10/2021 | Choi | | G11C 7/1057 |
| 2023/0336182 A1* | 10/2023 | Fortier | | H03L 7/099 |

FOREIGN PATENT DOCUMENTS

| | | | | |
|---|---|---|---|---|
| CN | 106411319 A | * | 2/2017 | ............. H03K 3/017 |
| GB | 2157904 A | * | 10/1985 | ......... G11B 20/1403 |
| JP | 2013042353 A | * | 2/2013 | ............. H05K 5/131 |
| KR | 20200033582 A | * | 3/2020 | |

OTHER PUBLICATIONS

Yang et al., "A Dual-Mode Truly Modular Programmable Fractional Divider Based on a 1/1.5 Divider Cell," IEEE Microwave and Wireless Components Letters, Oct. 31, 2005, vol. 15, No. 11, pp. 754-756.

Yang et al., "Low-Voltage Pulsewidth Control Loops for SOC Applications," IEEE Journal of Solid-State Circuits, Oct. 2002, vol. 37, No. 10, pp. 1348-1351.

* cited by examiner

FRACTIONAL DIVIDER WITH DUTY CYCLE REGULATION AND LOW SUBHARMONIC CONTENT

CROSS-REFERENCE TO RELATED APPLICATION

This application is a continuation of U.S. patent application Ser. No. 17/723,251(now U.S. Pat. No. 11,652,489), filed Apr. 18, 2022, the contents of which application are hereby incorporated by reference herein in their entireties.

TECHNICAL FIELD OF THE DISCLOSURE

The present disclosure generally relates to electronics, and more particularly to frequency divider circuitry (e.g., at a frequency synthesizer).

BACKGROUND

Both, systems used for wireless communication such as Long Term Evolution (LTE) and 5th generation (5G), and systems used for cable communication such as cable television networks, are radio systems in that they transmit and receive signals in the form of electromagnetic waves in the radio frequency (RF) range of approximately 3 kiloHertz (kHz) to 300 gigaHertz (GHz).

Frequency synthesizers are commonly used in wireless communication systems for generating a range of frequencies from a single oscillator. In recent years, the number of different wireless bands and standards in which a mobile device may communicate has increased dramatically. Different wireless communication standards may utilize different frequency ranges. For example, 5G alone may operate over frequency bands ranging from sub-6 gigahertz (GHz) to tens of GHz. Often a multi-standard system-on-chip (SOC) may utilize a frequency synthesizer to provide a wide range of frequencies. In some examples, a multi-standard SOC may utilize a voltage-controlled oscillator (VCO) having an octave tuning range with a frequency synthesizer, and the frequency synthesizer may be followed by a power of 2 frequency division (e.g., 1, 2, 4, 8, 16, etc.) to provide a wide range of frequencies.

VCO phase noise can be critical and often does not follow 20*log 10(Fosc) for wideband designs, where Fosc represents the frequency of the VCO output signal. In some examples, degradation can be as high as 12 decibel (dB)/octave. A narrow band VCO may generally provide a lower phase noise. Thus, in some examples, an octave range may be provided by using multiple VCOs (e.g., narrow band VCOs) with different tuning frequency ranges. When using multiple VCOs, the appropriate VCO may be turned on and multiplexed to the output based on the desired frequency. While utilizing multiple VCOs may provide a better performance, it may be inefficient in terms of die area. For instance, VCOs may be large in size due to inductor and capacitor arrays at the VCOs, and often only one out of a number of VCOs is turned on at a time. As process shrinks, transistors have become smaller in size, but metallization have not been improved, and VCO area may continue to be dominated by inductor and capacitor arrays.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Overview

Figure 1:
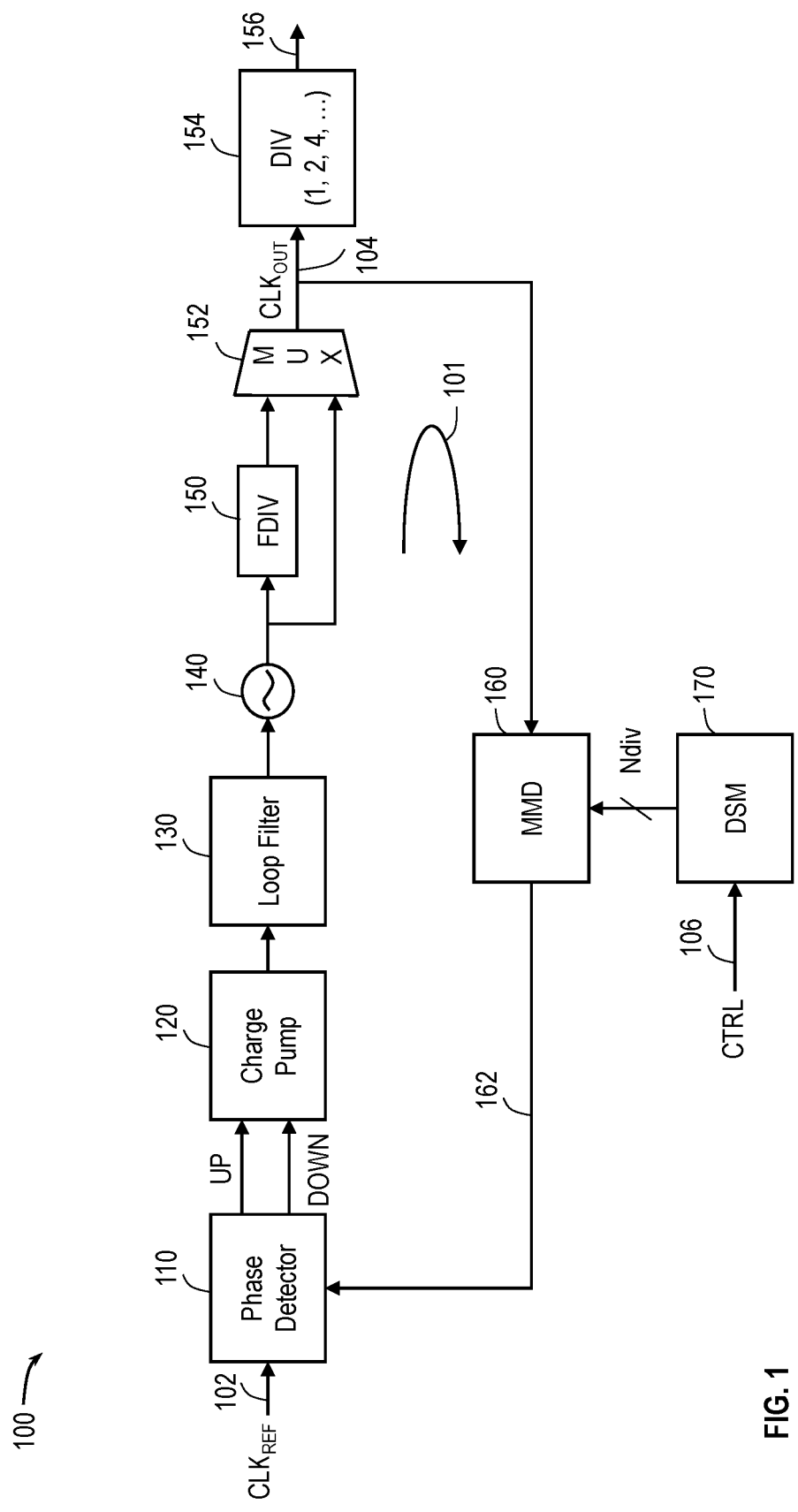
FIG. 1 is a block diagram illustrating an exemplary frequency synthesizer in which a duty cycle regulated, balanced fractional divider as disclosed herein may be implemented, according to some embodiments of the present disclosure.

The systems, methods and devices of this disclosure each have several innovative embodiments, no single one of which is solely responsible for all of the desirable attributes disclosed herein. Details of one or more implementations of the subject matter described in this specification are set forth in the description below and the accompanying drawings.

As described above, while utilizing multiple narrow band VCOs to provide a wide frequency range can be better for performance, it can be costly in terms of die area. One approach to eliminating one or more VCO cores yet providing the same wide frequency range is to use a fractional divider such as a frequency divider with a frequency division ratio of 1.5, which may be referred to as a 1.5 frequency divider. Alternatively, utilizing a 1.5 frequency divider may allow the use of narrower range VCO cores in a given area. However, a 1.5 frequency divider may generally output a clock signal with a non-50% duty cycle and/or with subharmonic spurs or distortion (e.g., at half the frequency of the clock signal), which may be undesirable for many systems. Accordingly, there is a need to provide 1.5 frequency divider with improved performance.

The present disclosure describes mechanisms for providing a fractional frequency divider with regulated duty cycle and a low subharmonic distortion. In one aspect of the present disclosure, an apparatus may include frequency divider circuitry including a first node to receive an input signal (e.g., a reference clock signal or a VCO signal) and fractional divider circuitry to generate a first signal by dividing a frequency of the input signal based on a frequency-division ratio (e.g., of 1.5). The first signal may be referred to as a frequency-divided signal. The first signal may have a first series of pulses with adjacent pulses triggered by opposite edges (e.g., rising edges and falling edges) of the input signal. Because rising edges and the falling edges of the input signal may be imbalanced (e.g., having different noise characteristics), the first signal can have subharmonic spurs (e.g., at half the frequency of the input signal).

To reduce or cancel the subharmonic spurs, the frequency divider circuitry may further include balance divider circuitry to generate a second signal having a same phase as the output (e.g., the first signal) of the fractional divider circuitry but triggered on opposite edges of the input signal. That is, the second signal may have a second series of pulses aligned (e.g., in time and/or phase) to the first series of pulses. In some aspects, the balance divider circuitry may include a replica circuit replicating a first circuit of the fractional divider circuitry, but the replica circuit may be triggered by opposite edges of the input signal than the first circuit. The frequency divider circuitry may further include a second node to combine the first signal and the second signal such that the combined signal may have at least a reduced subharmonic distortion than the first signal.

In some aspects, the fractional divider circuitry may include a first signal selection circuitry (e.g., the first circuit). The balance divider circuitry may have a second signal selection circuitry (e.g., the replica circuit) triggered by opposite edges of the input signal than the first signal selection circuitry. In some aspects, the first signal selection circuitry may be a first multiplexer, and the second signal selection circuitry may be a second multiplexer, where the first and second multiplexers may be of the same multiplexer cell type (e.g., same circuit topology), and thus may have the same switching characteristics. Each of the first signal selection circuitry and the second signal selection circuitry may have a respective first input, a respective second input, and a respective output, where the first input or the second input may be selectively coupled to the output at any given time. To reduce or cancel the subharmonic spurs, the first signal selection circuitry may switch from selecting the first respective input to selecting the second respective input responsive to one of a first rising edge or a first falling edge of the input signal, and the second signal selection circuitry may switch from selecting the respective first input to selecting the respective second input responsive to the other one of the first rising edge or the first falling edge of the input signal.

Additionally or alternatively, the fractional divider circuitry can include duty cycle correction circuitry to adjust the duty cycle of a frequency-divided signal (e.g., the first signal or the combined first and second signal with the reduced subharmonic content) and provide a duty cycle-adjusted signal (e.g., with a 50% duty cycle) as output. The duty cycle correction circuitry can be in the form of a delay-locked loop (DLL). In some aspects, the DLL may generate a rising edge of the duty cycle-adjusted signal from a rising edge of the frequency-divided signal, and generate a falling edge of the duty cycle-adjusted signal through active feedback. To that end, the DLL may include a filter (e.g., a low-pass filter) to output a direct current (DC) component (e.g., an average) of the frequency-divided signal. The DLL may further include an amplifier (e.g., a single-ended amplifier) having a first input to receive the DC component of the frequency-divided signal, a second input to receive a reference voltage, and an output to output an error signal. The error signal may correspond to a voltage difference between the DC component of the frequency-divided signal and the reference voltage. As such, to regulate the frequency-divided signal to a 50% duty cycle, the reference voltage may be set to about half of the supply voltage. Alternatively, the reference voltage may be set to any suitable voltage level according to a desired duty cycle. The DLL may further include a variable delay line controlled by the error signal to generate a feedback signal. In one aspect, the duty cycle correction circuitry may generate the falling edge of the duty cycle-adjusted signal further from a rising edge of the feedback signal. In another aspect, the DLL may generate the falling edge of the duty cycle-adjusted signal further by gating a falling edge of the frequency-divided signal by the feedback signal.

In some aspects, the apparatus may further include a phase-locked loop (PLL) including a VCO and the frequency divider circuitry coupled to the VCO. The PLL may be part of a frequency synthesizer, where the apparatus may further include an integer divider circuitry to divide the balanced and/or duty cycle-regulated frequency-divided signal. In some aspects, the apparatus may be a radio transceiver, for example, a radio transceiver integrated circuit (IC). For instance, the frequency divider circuitry may be in an RF domain, a digital input/output (IO) domain, or a clock tree domain of the IC. In some instances, the radio transceiver IC may include multiple balanced, and/or duty cycle-regulated frequency divider circuitries as disclosed herein, each in a different domain (e.g., RF domain, digital IO domain, and/or clock tree domain).

The systems, schemes, and mechanisms described herein advantageously provide a fractional frequency divider with reduced subharmonic distortion and/or a regulated duty cycle (e.g., of 50%). In one example, the improved fractional frequency divider may enable an IC to utilize a fewer number of VCO cores to provide same wide frequency range, and thus can reduce die area and cost. In another example, the improved fractional frequency divider may enable an IC to utilize VCO(s) with a reduced tuning range (e.g., narrower band) to achieve the same wide frequency range with a lower phase noise. In yet another example, the improved fractional frequency divider may reduce the maximum required VCO frequency. For instance, a transmitter that requires a 12 GHz digital-to-analog converter (DAC) clock for transmission and a 9 GHz analog-to-digital converter (ADC) clock for reception may utilize an 18 GHz VCO rather than a 24 GHz VCO, for example, when frequency divider of divide-by-powers-of-two only are used following a PLL. In general, the balanced, duty cycle-regulated fractional divider circuitry can be used in any suitable processing domains and/or in any suitable IC devices.

Example Frequency Synthesizer

FIG. 1 is a block diagram illustrating an exemplary frequency synthesizer 100 in which a duty cycle regulated, balanced fractional divider as disclosed herein may be implemented, according to some embodiments of the present disclosure. In some aspects, the frequency synthesizer 100 may be part of a RF transceiver (e.g., the RF device 2200 of FIG. 11) or transceiver IC. In one example, the frequency synthesizer 100 may operate in an RF domain to support ADC conversion, DAC conversion, frequency downconversion, or frequency upconversion. In another example, the frequency synthesizer 100 may operate in a digital 10 domain to support digital data input to a peripheral device of the transceiver and/or output from a peripheral device of the transceiver. In another example, the frequency synthesizer 100 may operate in a clock tree domain to provide various clock signals for operations at the transceiver. As shown, the frequency synthesizer 100 may include a PLL 101. The PLL 101 may include phase detector circuitry 110, charge pump circuitry 120, loop filter circuitry 130, VCO circuitry 140, frequency divider (FDIV) circuitry 150, and multiplexer (MUX) circuitry 152 in a forward path, and multi-modulus frequency divide (MMD) circuitry 160 and delta-sigma modulator (DSM) circuitry 170 in a feedback path.

The phase detector circuitry 110 may receive an input reference clock signal 102, shown as $CLK_{REF}$, and detect the difference in phase between the reference clock signal 102 and a feedback signal 162. The phase detector circuitry 110 may generate phase error correction or control signals, shown as UP and DOWN, indicative of whether the phase of the feedback signal 162 leads or lags the phase of the reference clock signal 102. The control signals may be provided to control the charge pump circuitry 120, which may sink current when receiving a "DOWN" pulse and sources current when receiving an "UP" pulse. The output pump current of the charge pump circuitry 120 may be provided to the loop filter 130, which may generate a control voltage from the charge pump current. The control voltage output by the loop filter 130 may be provided to the VCO circuitry 140.

In some instances, the VCO circuitry 140 may include multiple VCO cores (e.g., 2, 3, 4, or more). Each VCO core may oscillate at a higher or lower frequency based on the control voltage level provided by the loop filter 130. Further, each VCO core may cover a different frequency range or tuning range. At any one time, one of the VCO core may be active. For example, the frequency synthesizer 100 may be part of a transceiver, and a VCO core may be selected depending on the selected RF channel where the transceiver desires to operate at a particular time. In some examples, the active VCO core can be selected by switches. The selected VCO core may stabilize when the reference clock signal 102 and the feedback clock signal 162 are at the same phase and frequency. In general, any type of VCO can be used in the frequency synthesizer 100. For example, in one embodiment, each VCO core may include a switched capacitor array and a switched inductor array. Other VCO implementations can be used in other embodiments.

The selected VCO core from the VCO circuitry 140 may output a clock signal with a frequency controlled by the control voltage output by the loop filter 130. The VCO output signal may be provided to the frequency divider circuitry 150. In some aspects, the frequency divider circuitry 150 may be a fractional divider circuitry, for example, performing frequency-division by a fractional division ratio (e.g., a ratio of 1.5 or any other suitable fractional ratio). In some aspects, the frequency divider circuitry 150 may be implemented with duty cycle correction or regulation and/or subharmonic cancellation as disclosed herein. The multiplexer circuitry 152 may selectively couple the frequency-divided signal output by the frequency divide circuitry 150 or the VCO output signal to the output as an output clock signal 104, shown as $CLK_{OUT}$. The selection may be based on a selection signal, which may depend on the desired output clock frequency (e.g., whether to use a divide by 1.5 or a divide by 1 frequency division). The output clock signal 104 may be provided to the MMD 160.

The MMD 160 may divide the output clock signal 104 by a multi-modulus divider division factor M to provide the feedback signal 162. For example, the output clock signal 104 may have a frequency represented by Fout, and the feedback signal 162 may have a frequency represented by Fcomp, where Fcomp=Fout/M. The multi-modulus divider division factor M may be controlled by the DSM 170, which may in turn be controlled by a control signal 106, shown as CTRL. In some instances, the control signal 106 may have an integer portion N and a fractional portion f (e.g., represented by N.f), and the DSM 170 may provide a sequence of integers Ndiv close in value to the divide signal N.f, in such a way that the average value of Ndiv equals the divide signal N.f. In some aspects, the frequency synthesizer 100 may further include a power-of-2 frequency divider 154 to frequency-divide the output clock signal 104 by power-of-2 division ratio (e.g., 1, 2, 4, 8, 16, etc.) to achieve various frequencies for the final output clock signal 156.

Example Fractional Divider Circuitry

Figure 2:
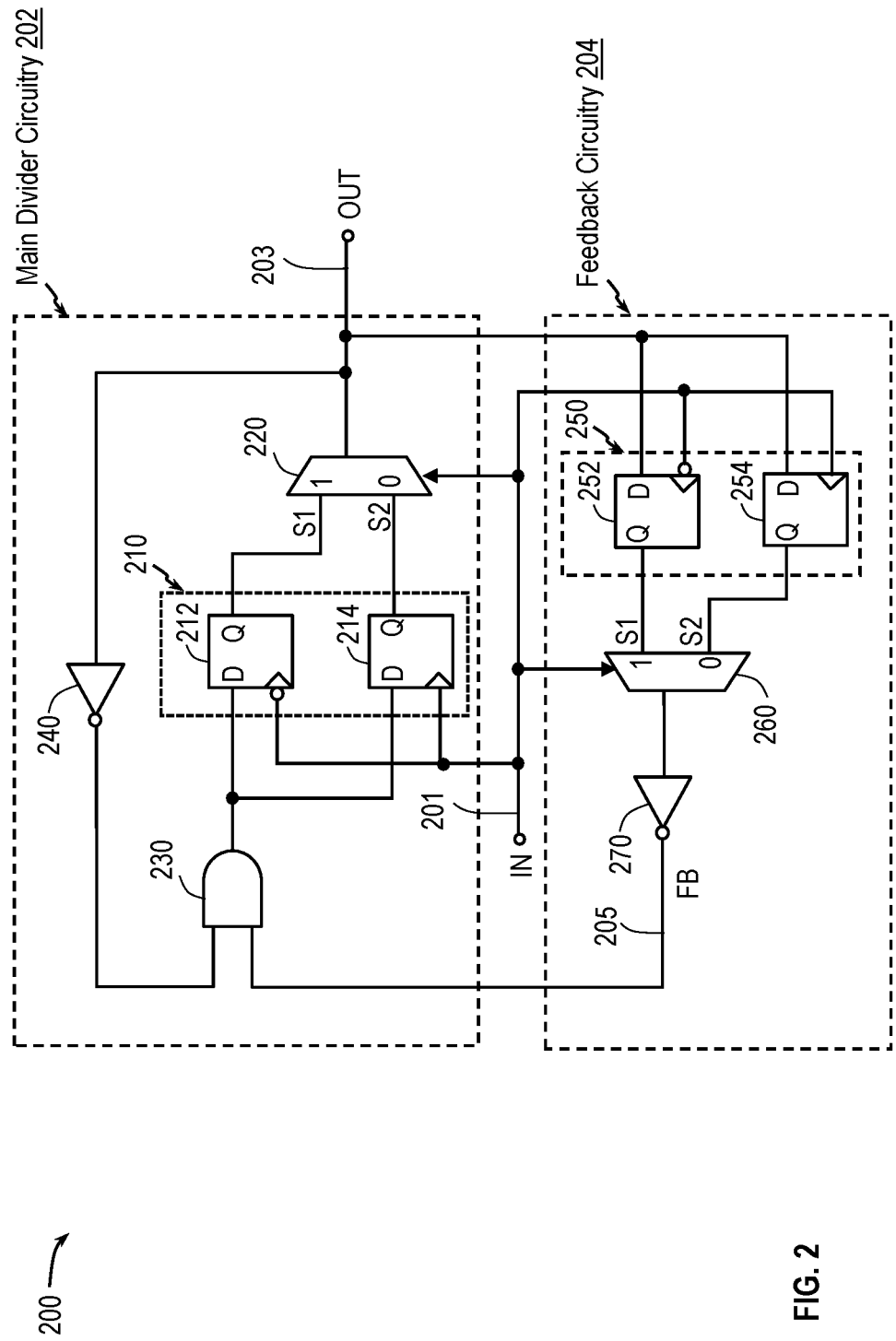
FIG. 2 is a schematic diagram illustrating exemplary fractional divider circuitry.

FIG. 2 is a schematic diagram illustrating exemplary fractional divider circuitry 200. In some aspects, the frequency synthesizer 100 of FIG. 1 may include the fractional divider circuitry 200 as part of the frequency divider circuitry 150. At a high level, the fractional divider circuitry 200 may receive an input signal 201 at an input node (shown as IN), divide the frequency of the input signal 201 by a frequency division ratio of 1.5 to generate a frequency-divided signal, and provide the frequency-divided signal as an output signal 203 at an output node (shown as OUT). The input signal 201 may include a series of input pulses at a certain frequency, Fin (e.g., as shown by 302 of FIG. 3). The output signal 203 may include a series of output pulses at a frequency of Fin/1.5 (e.g., as shown by 306 of FIG. 3).

As shown in FIG. 2, the fractional divider circuitry 200 may include main divider circuitry 202 and a feedback circuitry 204. The main divider circuitry 202 may include dual edge-triggered circuitry 210, a multiplexer 220 (e.g., signal selection circuitry), an AND gate 230, and an inverter 240. The dual edge-triggered circuitry 210 may include a first latch 212 and a second latch 214. The first latch 212 may include a data terminal (shown by "D") coupled to the output of the AND gate 230, an enable terminal (shown by "E") coupled to the input node to receive an inversion of the input signal 201, and an output terminal (shown by "Q") coupled to a first input (shown by "S1") of the multiplexer 220. The second latch 214 may include a data terminal (shown by "D") coupled to the output of the AND gate 230, an enable terminal (shown by "E") coupled to the input node to receive the input signal 201, and an output terminal (shown by "Q") coupled to a second input (shown by "S2") of the multiplexer 220. The multiplexer 210 may selectively couple the first input or the second input of the multiplexer 220 to the output node OUT. The AND gate 230 may include a first input coupled to the feedback circuitry 204 (e.g., to receive a feedback signal 205 (shown as FB)) and a second input coupled to the output of the inverter 240, where the input of the inverter 240 is coupled to the output node OUT.

The feedback circuitry 204 may include dual edge-triggered circuitry 250, a multiplexer 260 (e.g., signal selection circuitry), and an inverter 270. The dual edge-triggered circuitry 250 may include a third latch 252 and a fourth latch 254. The third latch 252 may include a data terminal (shown by "D") coupled to the output node, an enable terminal (shown by "E") coupled to the input node to receive an inversion of the input signal 201, and an output terminal (shown by "Q") coupled to a first input (shown by "S1") of the multiplexer 260. The fourth latch 254 may include a data terminal (shown by "D") coupled to the output node OUT, an enable terminal (shown by "E") coupled to the input node to receive the input signal 201, and an output terminal (shown by "Q") coupled to a second input (shown by "S2")

of the multiplexer 260. The multiplexer 260 may selectively couple the first input or the second input of the multiplexer 260 to the output of the multiplexer 260. The output of the multiplexer is coupled to the input of the inverter 270. The output of the inverter 270 is coupled to the main divider circuitry 202 to provide the feedback signal 205 to the main divider circuitry 202.

In operation, at the main divider circuitry 202, the first latch 212 and the second latch 214, each latches the output of the AND gate 230 to the respective output terminals (Q) based on triggers at the respective enable terminal (E). As shown, the first latch 212 is triggered on the falling edges of the input signal 201, whereas the second latch 214 is triggered on the rising edges of the input signal 201. The multiplexer 220 selects the output of the first latch 212 (at the first input S1) when the input signal 201 is in a logic high state and selects the output of the second latch 214 (at the second input S2) when the input signal 201 is in a logic low state.

The feedback circuitry 204 may keep track of which edge of the input signal 201 was being triggered last to generate the output signal 203 and may switch between the rising edges and the falling edges of the input signal 201 at every half cycle of the input signal 201. To that end, at the feedback circuitry 204, the third latch 252 and the fourth latch 254, each latches the output signal 203 to the respective output terminal (Q) based on triggers at the respective enable terminal (E). As shown, the third latch 252 is triggered on the falling edge of the input signal 201, whereas the fourth latch 254 is triggered on the rising edge of the input signal 201. The multiplexer 260 selects the output of the third latch 252 (at the first input S1) when the input signal 201 is in a logic high state and selects the output of the fourth latch 254 (at the second input S2) when the input signal 201 is in a logic low state. The output of the multiplexer 260 is inverted by the inverter 270 to provide the feedback signal 205. The AND gate 230 applies an AND operation to the feedback signal 205 and the output signal 203 inverted by the inverter 240 to control inputs to the first latch 212 and the second latch 214. The resulting output signal 203 at the output node may include a series of pulses with adjacent pulses triggered by opposite edges of the input signal 201.

Figure 3:
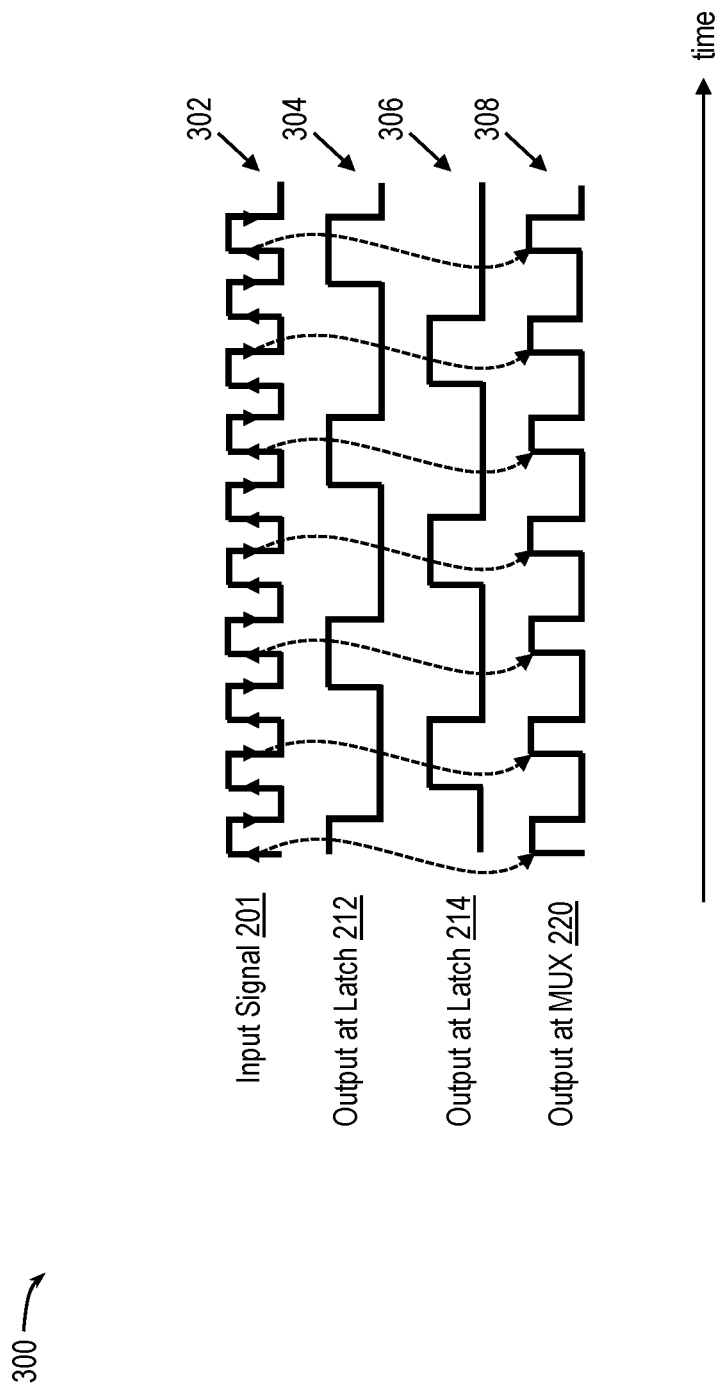
FIG. 3 is a timing diagram illustrating signals in exemplary fractional divider circuitry.

FIG. 3 is a timing diagram 300 illustrating signals in exemplary fractional divider circuitry 200 of FIG. 2. In FIG. 3, the x-axis may represent time in some arbitrary units. The plot 302 shows the input signal 201 of the fractional divider circuitry 200. The plot 304 shows the signal at the output of the first latch 212 triggered by the falling edges (shown by down arrows) of the input signal 201. The plot 306 shows the signal at the output terminal of the second latch 214 triggered by the rising edges (shown by up arrows) of the input signal 201. The plot 308 shows the signal at the output of the multiplexer 220, where the multiplexer 220 generates the output signal by alternating the selection from the output of the first latch 212 and the output of the second latch 214. As shown by the dotted arrows, the output of the multiplexer 220 (corresponding to the output signal 203) includes a series of pulses with adjacent pulses triggered by opposite edges of the input signal 201 at the input node of the fractional divider circuitry 200. More specifically, to provide the frequency division ratio of 1.5, when a first pulse of the output signal 203 is triggered by a rising edge of the input signal 201, an adjacent pulse prior to or after the first pulse is triggered by a falling edge the input signal 201, where the rising edge and the falling edge of the input signal 201 used for the triggers are spaced apart from each other by 1.5 cycle time of the input signal 201.

As can be seen from FIG. 3, while the fractional divider circuitry 200 can provide a frequency-divided signal (corresponding to the output at the multiplexer 220 or the output signal 203) from the input signal 201 with a 1.5 frequency division ratio, the duty cycle of the frequency-divided signal is less than 50% (e.g., about 33%). However, it may be desirable to have clock signals with a 50% duty cycle for many systems. As an example, some systems (e.g., sequential logic circuits) may use both rising edges and falling edges of a clock signal, and thus may be sensitive to the duty cycle of the clock signal. Further, because the rising edges and the negative edges of the input signal 201 can have different noise characteristics and delays in the fractional divider circuitry 200 and some pulses in the output signal 203 are triggered by rising edges of the input signal 201 while some other pulses in the output signal 203 are triggered by falling edges of the input signal 201, the output signal 203 can have subharmonic components or distortion. As an example, if the input signal 201 has a frequency of 12 GHz and the output signal 203 has a frequency of 8 GHz (after the 1.5 frequency division), the output signal 203 may include subharmonic distortion or spurs at 4 GHz away from the output frequency of 8 GHz. That is, the output signal 203 may have subharmonic components may be at about 4 GHz and 12 GHz. The subharmonic distortion can cause interference or noise in other signal paths of the system that uses the fractional divider circuitry 200.

Accordingly, the present disclosure provides techniques for regulating or correcting the duty cycle of the fractional divider circuitry 200 and/or reducing or cancelling subharmonic distortion in the fractional divider circuitry 200.

Example Duty Cycle Regulated, Balanced Fractional Divider Circuitry

Figure 4:
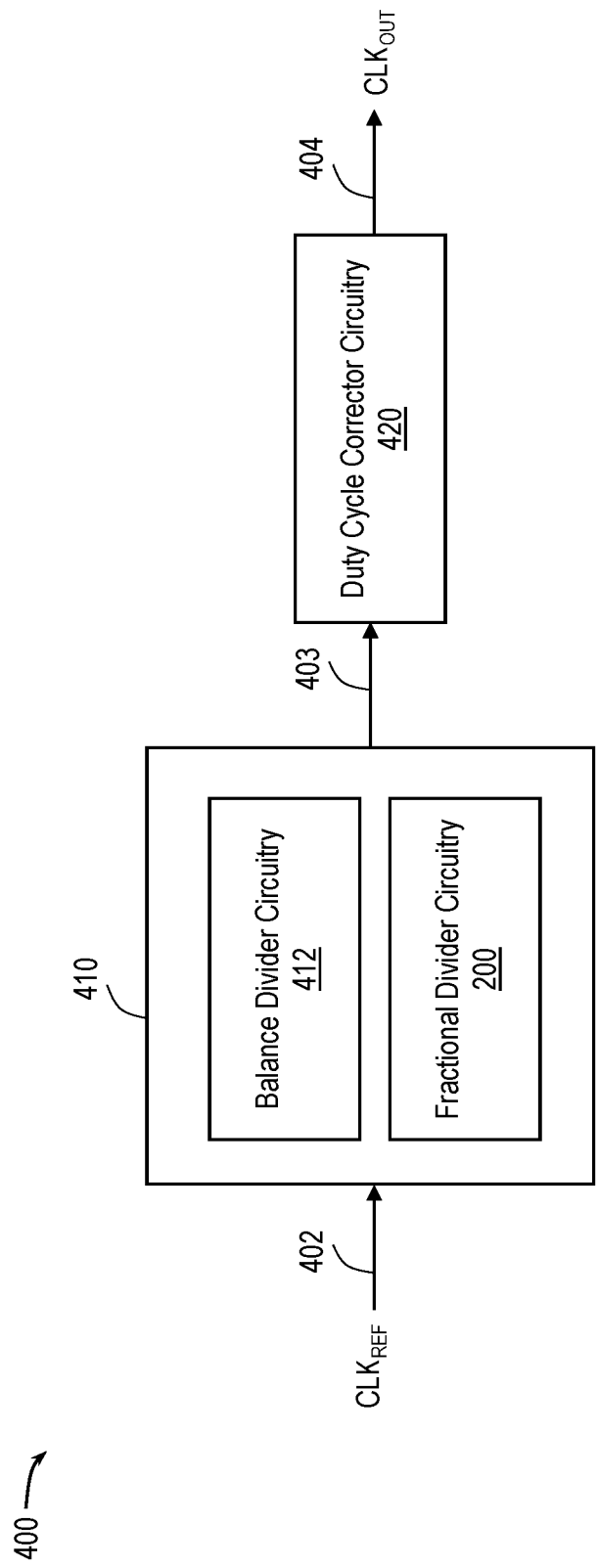
FIG. 4 is a block diagram illustrating an exemplary duty cycle regulated, balanced fractional divider circuitry, according to embodiments of the present disclosure.

FIG. 4 is a block diagram illustrating an exemplary duty cycle regulated, balanced fractional divider circuitry 400, according to embodiments of the present disclosure. In some aspects, the frequency synthesizer 100 of FIG. 1 may include the duty cycle regulated, balanced fractional divider circuitry 400 as part of the frequency divider circuitry 150. The duty cycle regulated, balanced fractional divider circuitry 400 may include a frequency divider circuitry 410 followed by duty cycle correction circuitry 420. The frequency divider circuitry 410 may include balance divider circuitry 412 and the fractional divider circuitry 200 of FIG. 2.

The duty cycle regulated, balanced fractional divider circuitry 400 may receive an input clock signal 402 represented by $CLK_{REF}$. The fractional divider circuitry 200 may frequency-divide the input clock signal 402 by a fractional frequency division ratio (e.g., of 1.5 as discussed above with reference to FIGS. 2-3) to provide a frequency-divided signal. The balance divider circuitry 412 may cancel or at least reduce subharmonic distortion in the frequency-divided signal as will be discussed more fully below with reference to FIGS. 5-6. That is, the frequency divider circuitry 410 may output a balanced frequency-divided signal 403, which may include at least a reduced subharmonic distortion compares to the frequency-divided signal (e.g., the output signal 203) generated by the fractional divider circuitry 200. The duty cycle correction circuitry 420 may adjust a duty cycle of the balanced frequency-divided signal 403 to provide an output clock signal 404 represented by $CLK_{OUT}$, for example, with a 50% duty cycle, as will be discussed more fully below with reference to FIGS. 7-10.

In general, a fractional frequency divider may include one of the balance divider circuitry 412 or the duty cycle correction circuitry 420. For example, a fractional frequency divider can include the balance divider circuitry 412 but not the duty cycle correction circuitry 420. Alternatively, a fractional frequency divider can include the duty cycle correction circuitry 420 and not the balance divider circuitry 412. In other examples, a fractional frequency divider may include both the balance divider circuitry 412 and the duty cycle correction circuitry 420 as shown in FIG. 4. Further, while FIG. 4 illustrates the frequency divider circuitry 410 utilizing the fractional divider circuitry 200 for fractional frequency division, the frequency divider circuitry 410 may utilize any suitable frequency divider circuitry.

Figure 5:
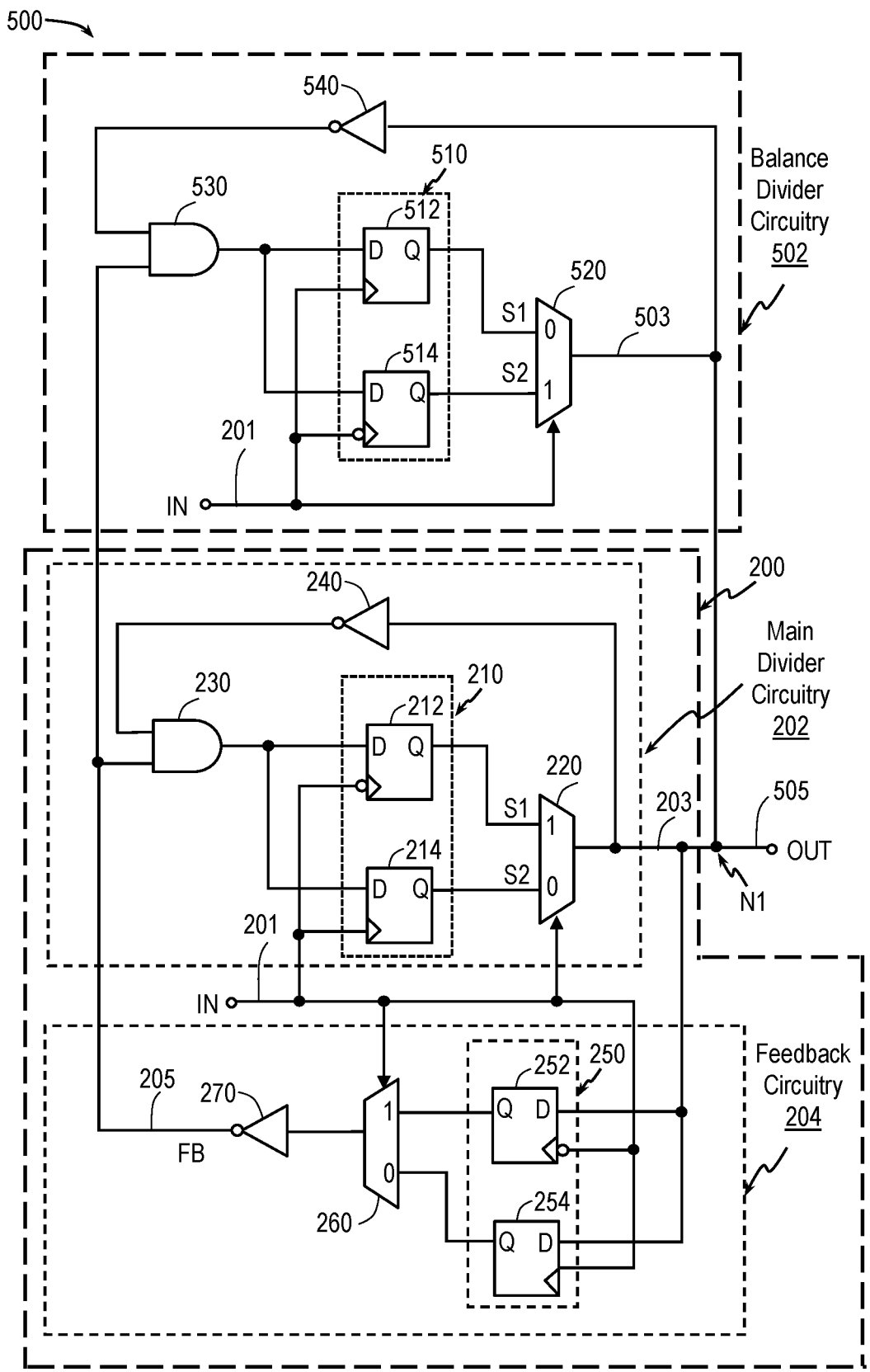
FIG. 5 is a schematic diagram illustrating exemplary balanced fractional divider circuitry, according to embodiments of the present disclosure.

FIG. 5 is a schematic diagram illustrating exemplary balanced fractional divider circuitry 500, according to embodiments of the present disclosure. In some aspects, the frequency synthesizer 100 of FIG. 1 may include the balanced fractional divider circuitry 500 as part of the frequency divider circuitry 150. The balanced fractional divider circuitry 500 may include balance divider circuitry 502 and the fractional divider circuitry 200 of FIG. 2. In some aspects, the balance divider circuitry 412 of FIG. 4 may implement subharmonic cancellation as shown in the balance divider circuitry 502.

In FIG. 5, the balance divider circuitry 502 may replicate the main divider circuitry 202. As shown, the balance divider circuitry 502 may include dual edge-triggered circuitry 510, a multiplexer 520 (e.g., signal selection circuitry), an AND gate 530, and an inverter 540 similar to the dual edge-triggered circuitry 210, the multiplexer 220, the AND gate 230, and the inverter 240, respectively, and arranged in a substantially similar arrangement as in the main divider circuitry 202. The dual edge-triggered circuitry 510 may include a fifth latch 512 and a sixth latch 514. Similar to the first latch 212 and the second latch 214, the fifth latch 512 and the sixth latch 514 may each latch the output of the AND gate 530 to a respective output terminal (Q) based on triggers at a respective enable terminal (E), where the AND gate 530 inputs are coupled to the feedback signal 205 and the output of the inverter 540. However, to balance the different noise characteristics or delays between the rising edges and the negative edges of the input signal 201, the triggering at the fifth latch 512 and the sixth latch 514 and the selection at the multiplexer 520 may be responsive to opposite edges of the input signal 201 than the triggering at the first latch 212 and the second latch 214 and the selection at the multiplexer 220.

For instance, the fifth latch 512 is triggered on the rising edges of the input signal 201 in contrast to the first latch 212 triggered on the falling edges of the input signal 201. Similarly, the sixth latch 514 is triggered on the falling edges of the input signal 201 in contrast to the second latch 214 triggered on the rising edges of the input signal 201. Further, the multiplexer 520 selects the first input S1 when the input signal 201 has a logic low level in contrast to the multiplexer 220 selecting the first input S1 when the input signal 201 has logic high level. Similarly, the multiplexer 520 selects the second input S2 when the input signal 201 has a logic high level in contrast to the multiplexer 220 selecting the second input S2 when the input signal 201 has logic low level.

Phrased differently, the multiplexer 520 may switch or transition from selecting the first input S1 to selecting the second input S2 responsive to a rising edge of the input signal 201 in contrast to the multiplexer 220 switching from selecting the first input S1 to selecting the second input S2 responsive to a falling edge of the input signal 201. Similarly, the multiplexer 520 may switch from selecting the second input S2 to selecting first input S1 responsive to a falling edge of the input signal 201 in contrast to the multiplexer 220 switching from selecting the second input S2 to selecting the first input S1 responsive to a rising edge of the input signal 201. In other words, the multiplexer 520 is triggered by opposite edges of the input signal 201 than the multiplexer 220 to select between the first input S1 and the second input S2.

Figure 6:
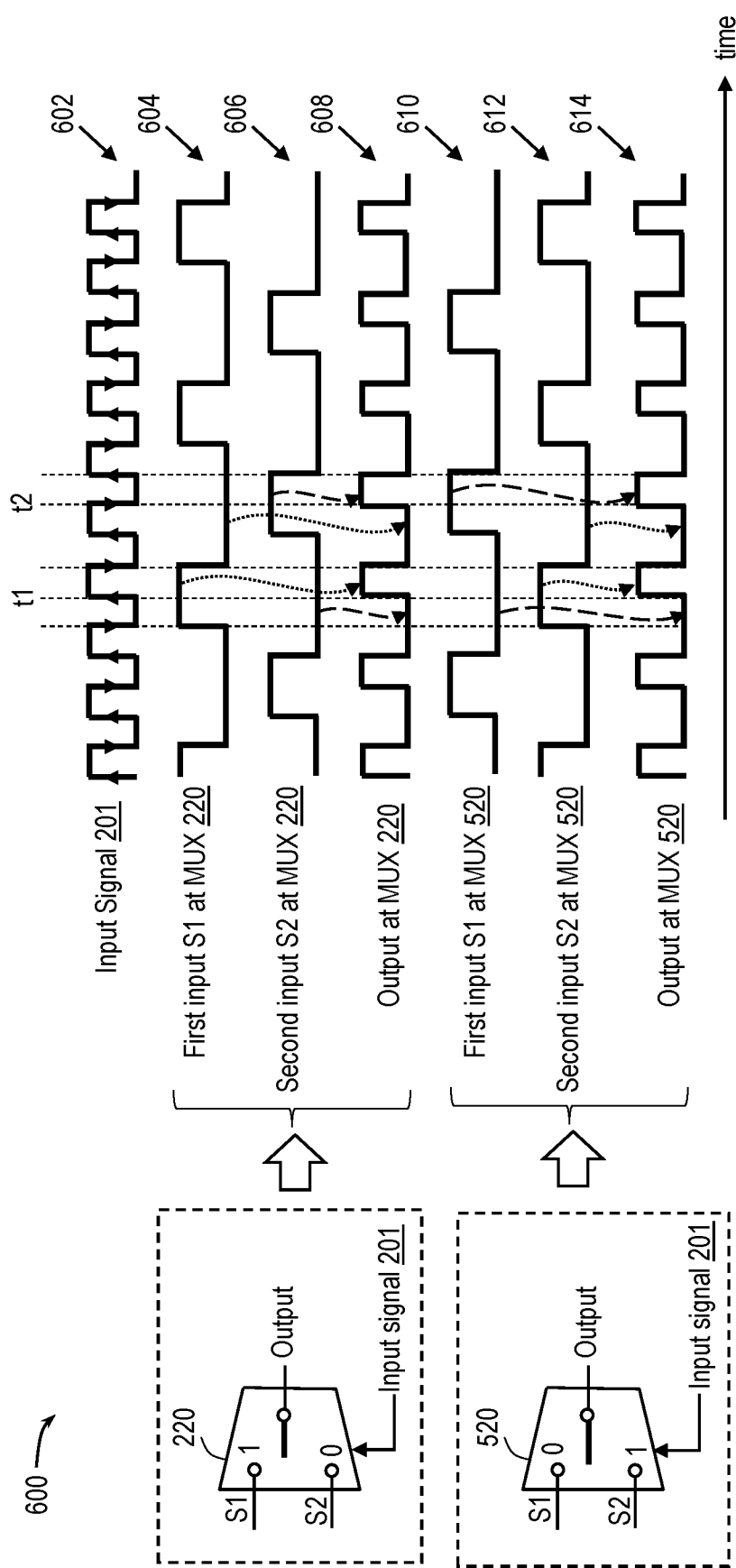
FIG. 6 is a timing diagram illustrating signals in exemplary balanced fractional divider circuitry, according to some embodiments of the present disclosure.

Triggering the fifth latch 512 and the sixth latch 514 on rising edges and falling edges of the input signal 201, respectively, and arranging the multiplexer 520 to select the output of the fifth latch 512 and the output of the sixth latch 514 based on the input signal 201 having a low logic level and a high logic level, respectively, the balance divider circuitry 502 may generate an output signal 503 (at the output of the multiplexer 520) having a series of pulses aligned (e.g., time-aligned and/or phase-aligned) to the series of pulses in the output signal 203 of the fractional divider circuitry 200 (e.g., as shown by 614 of FIG. 6). The output signal 503 of the balance divider circuitry 502 and the output signal 203 of the fractional divider circuitry 200 may be combined or summed at the node N1 to provide the output signal 505 at the output node OUT.

In some aspects, the multiplexer 520 at the balance divider circuitry 502 and the multiplexer 220 at the main divider circuitry 202 may have the same internal circuit topology or same IC multiplexer cell type. As such, if there are any systematic differences (e.g., different delays) in switching from the first input S1 to the second input S2 versus switching from the second input S2 to the first input S1, having the multiplexer 520 triggered on opposite edges of the input signal 201 than the multiplexer 220 can balance these differences. Balancing these differences can in turn cancel or reduce subharmonic component in the output signal 503 at the output node. That is, the output signal 505 obtained by combining the output signal 503 of the output signal 203 can have a reduced subharmonic distortion or spur compared to the output signal 203 alone. In some examples, the inclusion of the balance divider circuitry 502 can suppress a subharmonic spur by 40 dB (e.g., a power ratio of signal to a carrier signal) or more. That is, the output signal 503 can have a subharmonic spur (at a certain subharmonic frequency) that is about 40 dB lower than a subharmonic spur (at the same subharmonic frequency) in the output signal 203.

While FIG. 5 illustrates the balance divider circuitry 502 replicating the entire main divider circuitry 202, aspects are not limited thereto. For example, in some aspects, the balance divider circuitry 502 may replicate a portion of the main divider circuitry 202. In other words, the balance divider circuitry 502 may include a replica circuit replicating a first circuit of the main divider circuitry 202 and the replica circuit may be arranged to be triggered on opposite edges of the input signal 201 compared to the first circuit to balance the different noise characteristics or delays between the rising edges and the negative edges of the input signal 201 and thereby reducing subharmonic spurs. In an example, the first circuit may correspond to the multiplexer 220, and the replica circuit may be a multiplexer in which the selection is triggered by opposite edges of the input signal 201 than the multiplexer 220. For instance, the replicated multiplexer (the replica circuit) may be connected in parallel with the multiplexer 220.

FIG. 6 is a timing diagram 600 illustrating signals in the balanced fractional divider circuitry 500 of FIG. 5, according to some embodiments of the present disclosure. In FIG. 6, the x-axis may represent time in some arbitrary units. The plot 602 illustrates the input signal 201 at the input node (IN) of the balanced fractional divider circuitry 500. The plots

604, 606, and 608 show signals at the first input S1 (output of the first latch 212), second input S2 (output for the second latch 214), and output, respectively, of the multiplexer 220 at the main divider circuitry 202. The plots 610, 612, and 614 show signals at the first input S1 (output for the fifth latch 512), second input S2 (output for the sixth latch 514), and output, respectively, of the multiplexer 520 at the balance divider circuitry 502.

The multiplexer 220 from the main divider circuitry 202 and the multiplexer 520 from the balance divider circuitry 502 of FIG. 5 are shown on the left side of the FIG. 6. As can be seen, the multiplexer 520 from the balance divider circuitry 502 perform signal selection (e.g., between the first input S1 and the second input S2) responsive to opposite edges of the input signal 201 than the multiplexer 220 from the main divider circuitry 202. As an example, at time t1, the multiplexer 220 switches from the second input S2 to the first input S1 based on a rising edge of the input signal 201, whereas the multiplexer 520 switches from the first input S1 to the second input S2 based on the rising edge of the input signal 201. At time t2, the multiplexer 220 switches from the first input S1 to the second input S2 based on a falling edge of the input signal 201, whereas the multiplexer 520 switches from the second input S2 to the first input S1 based on the falling edge of the input signal 201.

Figure 7:
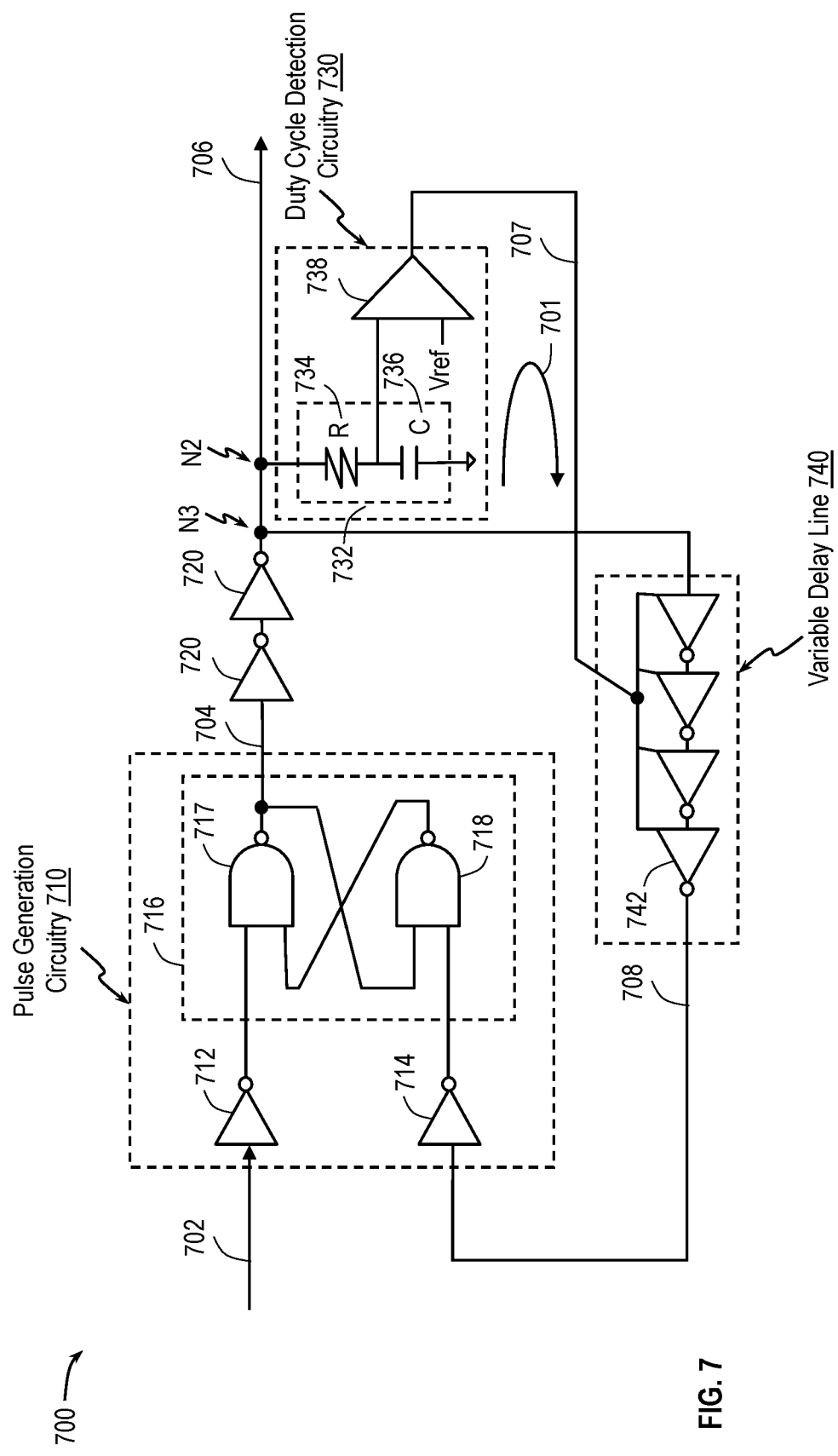
FIG. 7 is a schematic diagram illustrating exemplary duty cycle correction circuitry, according to embodiments of the present disclosure.

FIG. 7 is a schematic diagram illustrating exemplary duty cycle correction circuitry 700, according to embodiments of the present disclosure. In some aspects, the frequency synthesizer 100 of FIG. 1 may include the duty cycle correction circuitry 700 as part of the frequency divider circuitry 150. In some aspects, the duty cycle correction circuitry 420 of FIG. 4 may adjust or regulate the duty cycle (e.g., to a target duty cycle of 50%) of a frequency-divided signal using the duty cycle correction circuitry 700. As shown, the duty cycle correction circuitry 700 may include a DLL 701. The DLL 701 may include pulse generation circuitry 710, inverters 720, and duty cycle detection circuitry 730 in a forward path, and a variable delay line 740 in a feedback path.

In the illustrated example of FIG. 7, the pulse generation circuitry 710 may include a set-reset (SR) flip-flop 716 including a pair of cross-coupled NAND gates 717 and 718, an inverter 712 coupled to an input of the NAND gate 717 and another inverter 714 coupled to an input of the NAND gate 718. The pulse generation circuitry 710 may receive a frequency-divide signal 702. The frequency-divide signal 702 may be a frequency-divided signal 702 output by a fractional divider circuitry similar to the fractional divider circuitry 200 or the frequency divider circuitry 410. The frequency-divide signal 702 may be inverted by the inverter 712 and used to set and drive an output signal 704 to a logic high state. A feedback signal 708 from the DLL 701 may be inverted by the inverter 714 and used to reset and drive the output signal 704 to a logic low state. That is, the pulse generation circuitry 710 may generate the rising edges of the output signal 704 from the rising edges of the frequency-divide signal 702 and generate the falling edges of the output signal 704 from the rising edges of the feedback signal 708. The pulse generation circuitry 710 may be coupled to the inverters 720 to delay the output of the output signal 704 from the duty cycle correction circuitry 700. The delayed output signal at the output (e.g., at node N2) of the duty cycle correction circuitry 700 is shown by 706. While FIG. 7 illustrates two inverters 720 connected in series at the output of the pulse generation circuitry 710, any suitable number of inverters 720 may be arranged between the pulse generation circuitry 710 and the output of the duty cycle correction circuitry 700 depending on the desired delay.

The duty cycle detection circuitry 730 is coupled to the output node N2. The duty cycle detection circuitry 730 may detect the duty cycle of the output signal 706 and guide the controlling of the variable delay line 740 in the feedback path. As shown, the duty cycle detection circuitry 730 may include a filter 732 and an error amplifier 738. The filter 732 may be implemented as a lowpass filter coupled between the node N2 and a ground potential (shown by the inverted triangle symbol). The filter 732 may filter the output signal 706. In the illustrated example, the filter 732 may include a resistor R 734 connected in series with a capacitor C 736. The filter 732 may output a DC component of the output signal 706. The error amplifier 738 may include a first input coupled to a junction or node between the resistor R 734 and the capacitor C 736, and a second input coupled to a reference voltage shown as Vref. The error amplifier 738 may be a single-ended amplifier and may compare the DC component of the output signal 706 to the reference voltage and output an error signal 707 (e.g., a voltage difference between the DC component of the output signal 706 and the reference voltage). As discussed above, in some aspects, it may be desirable to have a frequency-divided signal with a 50% duty cycle. To achieve a target duty cycle of 50%, the reference voltage may be set to about half of the supply voltage. That is, if the output signal 706 has a 50% duty cycle, the average (or DC component) of the output signal 706 may be about half of the supply voltage, and hence the error signal 707 may be at zero Volt. If, however, there output signal 706 has a duty cycle lower than 50%, the average (or DC component) of the output signal 706 may be less than half of the supply voltage, and hence the error signal 707 can be indicative of the amount of a duty cycle error in the output signal 706. For example, the voltage level of the error signal 707 may be about proportional to a duty cycle error amount. As such, the error signal 707 can be used to control the variable delay line 740.

The variable delay line 740 may include a plurality of delay elements 742, for example, implemented as inverters as shown in the example. The variable delay line 740 may be coupled to the output of the last inverter 720, for example, at node N3, which can be the same node as N2. The variable delay line 740 may delay the output signal 706 based on the error signal 707 to provide the feedback signal 708. The variable delay line 740 may be a voltage-controlled delay line and may apply an amount of delay in response to the error voltage (the error signal 707) output by the error amplifier 738. As discussed above, feedback signal 708 is used to reset and drive the output signal 704 to a logic low state. That is, the DLL 701 may adjust the delay of the feedback signal 708 until the output signal 704 or the output signal 706 is at the target duty cycle of 50%. Accordingly, the output signal 704 or 706 may be referred to as the duty cycle-adjusted frequency-divided signal.

Because the feedback signal 708 is generated based on circuitries at the filter 732 and error amplifier 738 and the variable delay line 740, the feedback signal 708 may have noise characteristics introduced by those circuitries. Further, because the falling edges of the output signal 704 is generated from the feedback signal 708, the falling edges of the output signal 704 and the delayed output signal 706 can have noise characteristics from the variable delay line 740 and the duty cycle detection circuitry 730. Accordingly, the rising edges of the output signal 706 or the duty cycle-adjusted frequency-divided signal output may be clean (e.g., low noise) but the falling edges of the output signal 706 can be noisy. By having at least clean rising edges in the output signal 706, the duty cycle correction circuitry 700 may be helpful in some circuitries such as ADC circuitries (e.g., pipeline ADCs) in which rising edges are used for sampling in sample and hold circuitries and falling edges are used to transition between a sampling stage and a hold stage. The duty cycle correction techniques provided by the duty cycle correction circuitry 700 may also allow for maximizing the amplifier 738 settling time without much added jitter to the sampled data. Accordingly, the duty cycle correction circuitry 700 may be beneficial for use in providing clock signals to ADC circuitries.

In other aspects, the duty cycle detection circuitry 730 can be configured to meet a target duty cycle other than 50%. For instance, it may be desirable to have a longer or wider clock pulse to allow for a certain circuit operation. For instance, the reference voltage at the error amplifier 738 can be varied to change the duty cycle of the output signal 706, for example, by adding an offset to the reference voltage. Varying the duty cycle can allow for tradeoffs between sample time and a multiplying digital-to-analog converter (MDAC) settling in a pipeline ADC, for example.

Figure 8:
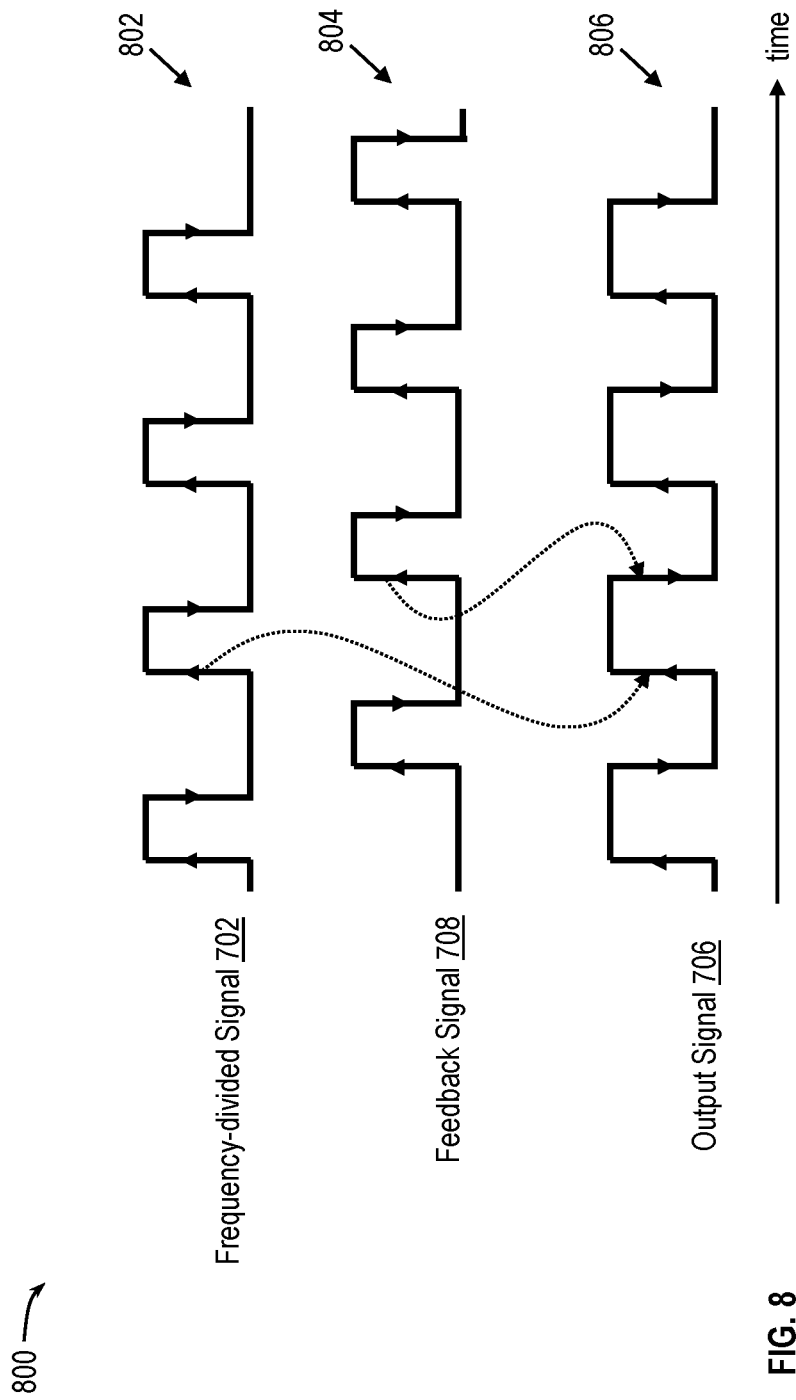
FIG. 8 is a timing diagram illustrating signals in exemplary duty cycle correction circuitry, according to embodiments of the present disclosure.

FIG. 8 is a timing diagram 800 illustrating signals in the duty cycle correction circuitry 700 of FIG. 7, according to embodiments of the present disclosure. In FIG. 8, the x-axis may represent time in some arbitrary units. The rising edges of the pulses are shown by up arrows and the falling edges of the pulses are shown by down arrows. The plot 802 illustrates the frequency-divided signal 702 at the input of the duty cycle correction circuitry 700. The plot 804 illustrates the feedback signal 708 generated based on the duty cycle detection circuitry 730 and the variable delay line 740. The plot 806 illustrates the output signal 706 (the duty cycle-adjusted signal) at the output of the duty cycle correction circuitry 700. As shown by the dotted arrows, a rising edge of the output signal 706 is generated from a rising edge of the frequency-divided signal 702 while a falling edge of the output signal 706 is generated from a rising edge of the feedback signal 708. As can be seen from FIG. 8, the frequency-divided signal 702 at the input of the duty cycle correction circuitry 700 has a duty cycle of about 33%, and the output signal 706 at the output of the duty cycle correction circuitry 700 is regulated to have a duty cycle of about 50%.

Figure 9:
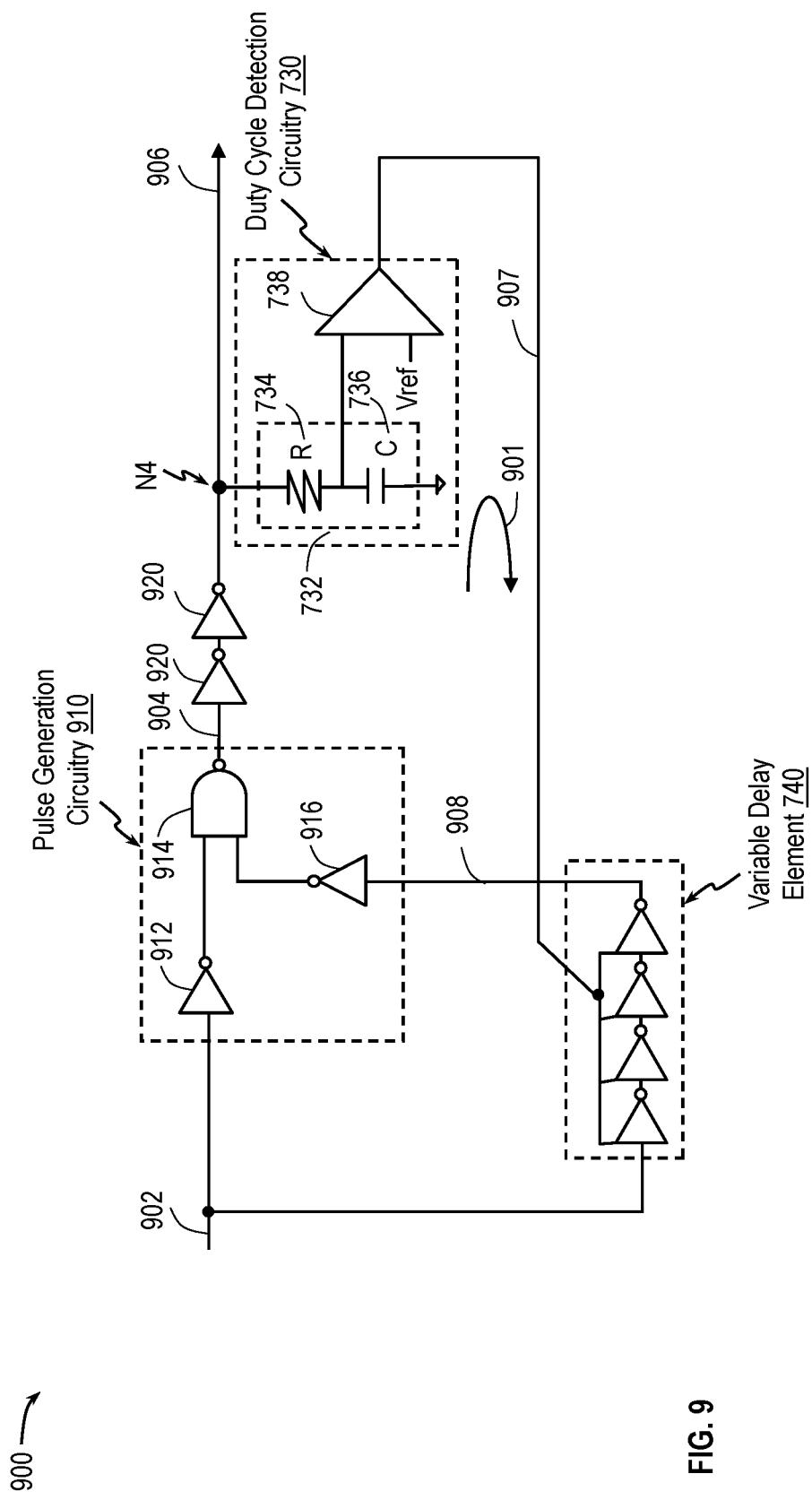
FIG. 9 is a schematic diagram illustrating exemplary duty cycle correction circuitry, according to embodiments of the present disclosure.

FIG. 9 is a schematic diagram illustrating exemplary duty cycle correction circuitry 900, according to embodiments of the present disclosure. In some aspects, the frequency synthesizer 100 of FIG. 1 may include the duty cycle correction circuitry 900 as part of the frequency divider circuitry 150. In some aspects, the duty cycle correction circuitry 420 of FIG. 4 may adjust or regulate the duty cycle (e.g., to a target duty cycle of 50%) of a frequency-divided signal using the duty cycle correction circuitry 900. The duty cycle correction circuitry 900 may share many elements with the duty cycle correction circuitry 700 of FIG. 7; for brevity, a discussion of these elements is not repeated, and these elements may take the form of any of the embodiments disclosed herein. As shown in FIG. 9, the duty cycle correction circuitry 900 may include a DLL 901. The DLL 901 may include pulse generation circuitry 910, inverters 920, and duty cycle detection circuitry 730 in a forward path, and a variable delay line 740 in a feedback path.

In the illustrated example of FIG. 9, the pulse generation circuitry 910 may include a 2-input NAND gate 914, an inverter 912 coupled to an input of the NAND gate 914 and another inverter 916 coupled to the other input of the NAND gate 914. The pulse generation circuitry 910 may receive a frequency-divide signal 902. The frequency-divide signal 902 may be a frequency-divided signal 702 output by a fractional divider circuitry similar to the fractional divider circuitry 200 or the frequency divider circuitry 410. The frequency-divide signal 902 may be inverted by the inverter 912 and used to drive an output signal 904 (at the output of the NAND gate 914) to a logic high state. A feedback signal 908 may be inverted by the inverter 916 and used to gate or delay the resetting of the output signal 904 to a logic low state. That is, the pulse generation circuitry 910 may operate to extend the pulses of the frequency-divided signal 902 by generating the rising edges of the output signal 904 from rising edges of the frequency-divide signal 902 and generating the falling edges of the output signal 904 from a delayed version of the falling edges of the frequency-divided signal 902.

Similar to the duty cycle correction circuitry 700, the pulse generation circuitry 910 may be coupled to the inverters 920 to delay the output of the output signal 904 from the duty cycle correction circuitry 900. The delayed output signal at the output (e.g., at node N4) of the duty cycle correction circuitry 900 is shown by 906. While FIG. 9 illustrates two inverters 920 at the output of the pulse generation circuitry 910, any suitable number of inverters 920 may be arranged between the pulse generation circuitry 910 and the output of the duty cycle correction circuitry 900 depending on the desired delay. Further, the duty cycle detection circuitry 730 is coupled to the output node N3 may operate as discussed above with reference to FIG. 7. The duty cycle detection circuitry 730 may provide an error signal 907 based on a comparison between a DC component or a signal average of the output signal 906 and the reference voltage Vref. The error signal 907 may be a voltage difference between the DC component of the output signal 906 and the reference voltage Vref and may be used to control the variable delay line 740.

The variable delay line 740 may be coupled to the input of the duty cycle correction circuitry 900 to receive the frequency-divided signal 902. The variable delay line 740 may generate the feedback signal 908 to gate or delay the falling edges of the frequency-divided signal 902 based on the error signal 907 (which indicates a deviation of the duty cycle of the output signal 906 from a target duty cycle of 50%). That is, the DLL 901 may adjust the delay of the feedback signal 908 until the output signal 904 or the output signal 906 is at the target duty cycle of 50%. Accordingly, the output signal 904 or 906 may be referred to as the duty cycle-adjusted frequency-divided signal. In some aspects, a voltage offset can be added to the error amplifier 738 to achieve a certain desired duty cycle (e.g., greater than or less than 50%).

Similar to the duty cycle correction circuitry 700, because the feedback signal 908 is generated based on circuitries at the filter 732 and error amplifier 738 and the variable delay line 740, the feedback signal 908 may have noise characteristics introduced by those circuitries. Further, because the falling edges of the output signal 904 is generated from the feedback signal 908, the falling edges of the output signal 904 and the delayed output signal 906 can have noise characteristics from the variable delay line 740 and the duty cycle detection circuitry 730. As such, by having at least clean rising edges in the output signal 906, the duty cycle correction circuitry 900 may be helpful in some circuitries such as ADC circuitries in which rising edges may be used for triggering certain operations and falling edges may be used for transitioning between operational states as discussed above with reference to FIG. 7.

Figure 10:
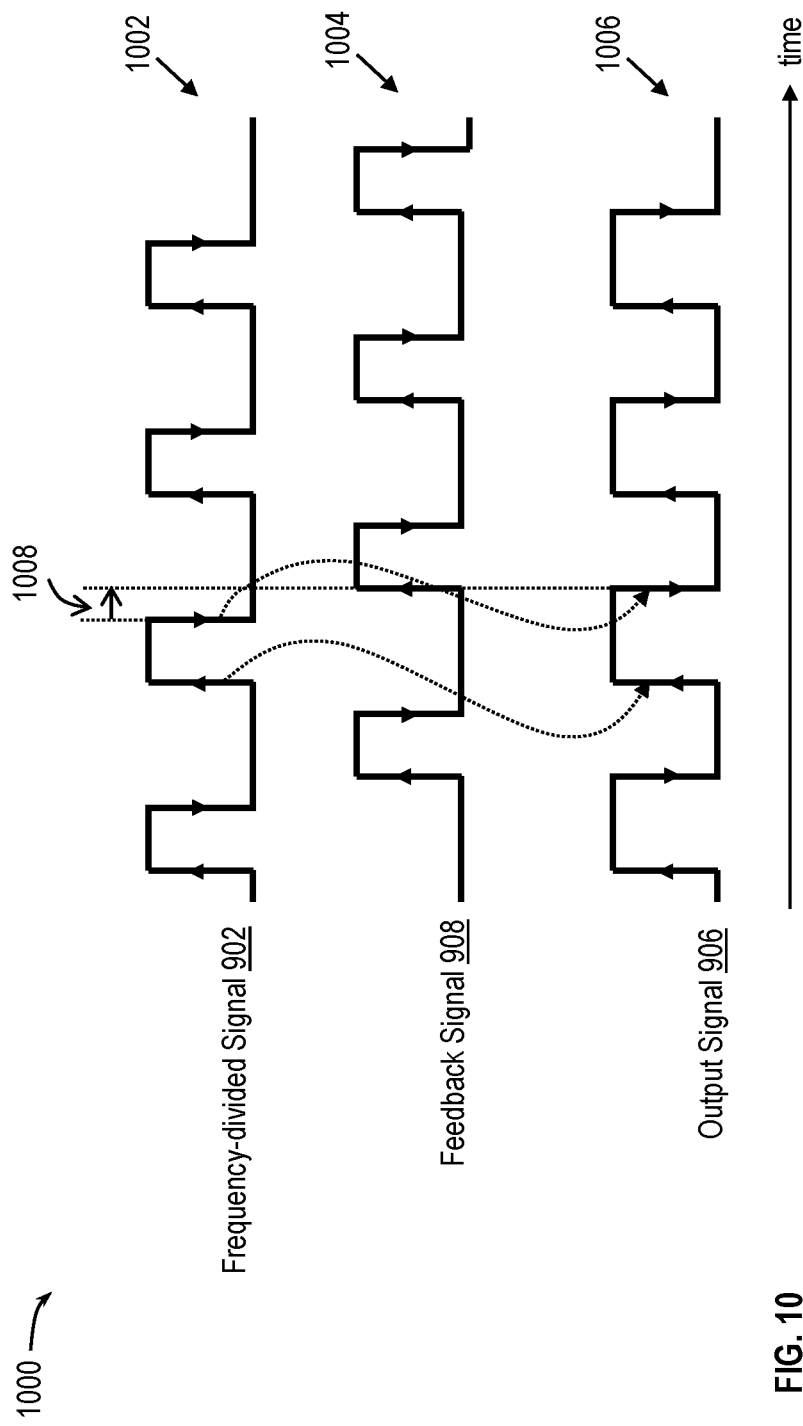
FIG. 10 is a timing diagram illustrating signals in an exemplary duty cycle correction circuitry, according to embodiments of the present disclosure.

FIG. 10 is a timing diagram 1000 illustrating signals in the duty cycle correction circuitry 900 of FIG. 9, according to embodiments of the present disclosure. In FIG. 10, the x-axis may represent time in some arbitrary units. The rising edges of the pulses are shown by up arrows and the falling edges of the pulses are shown by down arrows. The plot 1002 illustrates the frequency-divided signal 902 at the input of the duty cycle correction circuitry 900. The plot 1004 illustrates the feedback signal 908 generated based on the duty cycle detection circuitry 730 and the variable delay line 740. The plot 1006 illustrates the output signal 906 (the duty cycle-adjusted signal) at the output of the duty cycle correction circuitry 900. As shown by the dotted arrows, a rising edge of the output signal 906 is generated from a rising edge of the frequency-divided signal 902 while a falling edge of the output signal 906 is generated by delaying a falling edge of the frequency-divided signal 902 by a delay 1008, which is responsive to a rising edge of the feedback signal 908. As can be seen from FIG. 10, the frequency-divided signal 902 at the input of the duty cycle correction circuitry 900 has a duty cycle of about 33%, and the output signal 906 at the output of the duty cycle correction circuitry 900 is regulated to have a duty cycle of about 50%.

While FIG. 7 illustrates the duty cycle correction circuitry 700 utilizing an SR flip-flop 716 for pulse generation and FIG. 9 illustrates the duty cycle correction circuitry 900 utilizing a NAND gate 914 for pulse generation, other implementations of pulse generation circuitry can be used in a DLL for duty cycle correction or regulation.

Example RF Device

Figure 11:
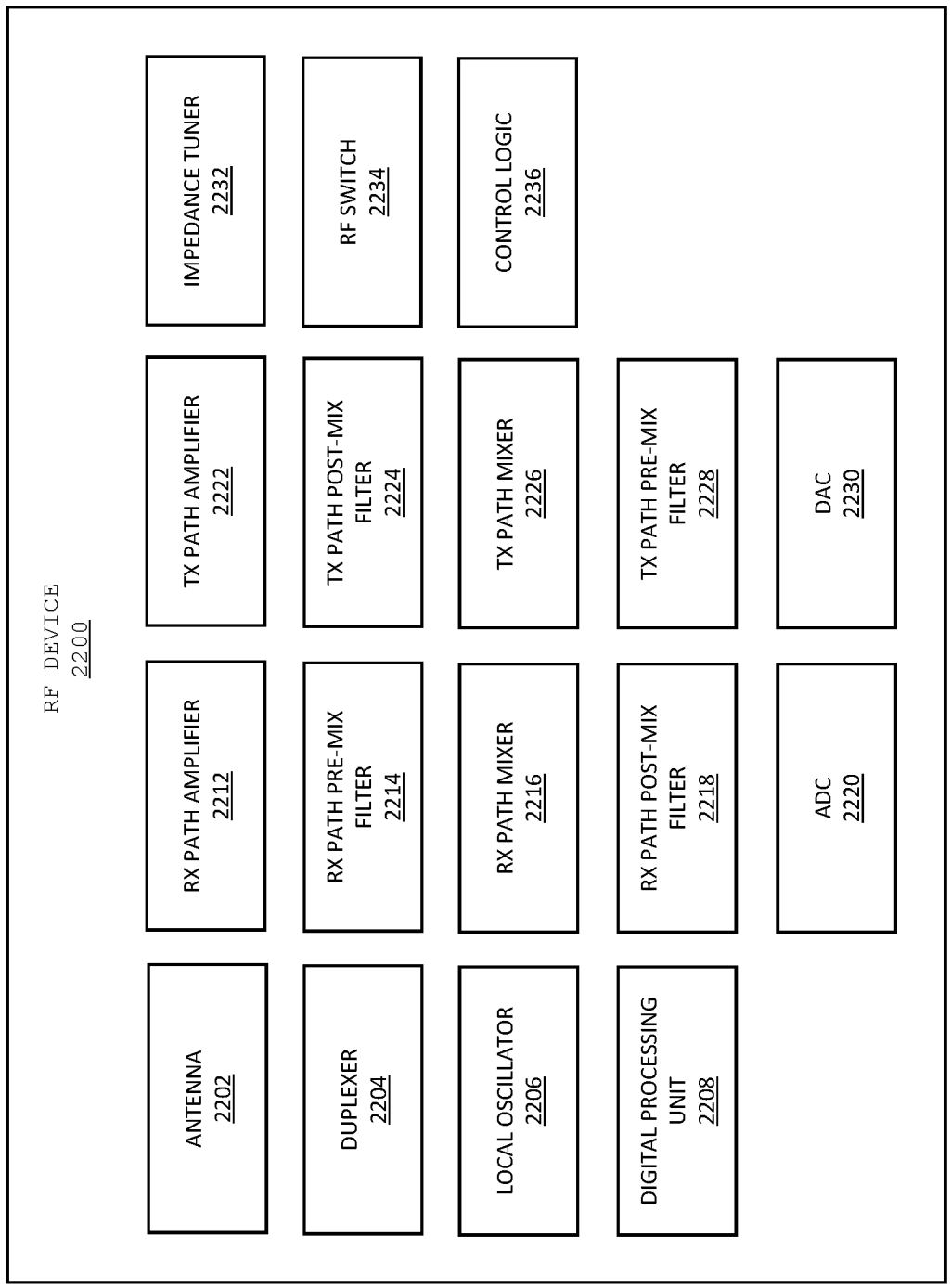
FIG. 11 is block diagram illustrating an exemplary RF device, according to embodiments of the present disclosure.

FIG. 11 is block diagram illustrating an exemplary RF device 2200, e.g., an RF transceiver, in which one or more duty cycle regulated, balanced fractional dividers as disclosed herein may be implemented, according to embodiments of the present disclosure.

In general, the RF device 2200 may be any device or system that may support wireless transmission and/or reception of signals in the form of electromagnetic waves in the RF range of approximately 3 kilohertz (kHz) to approximately 300 Gigahertz (GHz). In some embodiments, the RF device 2200 may be used for wireless communications, e.g., in a base station (BS) or a UE device of any suitable cellular wireless communications technology, such as GSM, WCDMA, or LTE. In a further example, the RF device 2200 may be used as, or in, e.g., a BS or a UE device of a millimeter-wave wireless technology such as fifth generation (5G) wireless (i.e., high-frequency/short wavelength spectrum, e.g., with frequencies in the range between about 20 and 60 GHz, corresponding to wavelengths in the range between about 5 and 15 millimeters). In yet another example, the RF device 2200 may be used for wireless communications using Wi-Fi technology (e.g., a frequency band of 2.4 GHz, corresponding to a wavelength of about 12 cm, or a frequency band of 5.8 GHz, spectrum, corresponding to a wavelength of about 5 cm), e.g., in a Wi-Fi-enabled device such as a desktop, a laptop, a video game console, a smart phone, a tablet, a smart TV, a digital audio player, a car, a printer, etc. In some implementations, a Wi-Fi-enabled device may, e.g., be a node in a smart system configured to communicate data with other nodes, e.g., a smart sensor. Still in another example, the RF device 2200 may be used for wireless communications using Bluetooth technology (e.g., a frequency band from about 2.4 to about 2.485 GHz, corresponding to a wavelength of about 12 cm). In other embodiments, the RF device 2200 may be used for transmitting and/or receiving RF signals for purposes other than communication, e.g., in an automotive radar system, or in medical applications such as magneto-resonance imaging (MRI).

In various embodiments, the RF device 2200 may be included in frequency-division duplex (FDD) or time-domain duplex (TDD) variants of frequency allocations that may be used in a cellular network. In an FDD system, the uplink (i.e., RF signals transmitted from the UE devices to a BS) and the downlink (i.e., RF signals transmitted from the BS to the US devices) may use separate frequency bands at the same time. In a TDD system, the uplink and the downlink may use the same frequencies but at different times.

Several components are illustrated in FIG. 11 as included in the RF device 2200, but any one or more of these components may be omitted or duplicated, as suitable for the application. For example, in some embodiments, the RF device 2200 may be an RF device supporting both of wireless transmission and reception of RF signals (e.g., an RF transceiver), in which case it may include both the components of what is referred to herein as a transmit (TX) path and the components of what is referred to herein as a receive (RX) path. However, in other embodiments, the RF device 2200 may be an RF device supporting only wireless reception (e.g., an RF receiver), in which case it may include the components of the RX path, but not the components of the TX path; or the RF device 2200 may be an RF device supporting only wireless transmission (e.g., an RF transmitter), in which case it may include the components of the TX path, but not the components of the RX path.

In some embodiments, some or all the components included in the RF device 2200 may be attached to one or more motherboards. In some embodiments, some or all these components are fabricated on a single die, e.g., on a single system on chip (SoC) die.

Additionally, in various embodiments, the RF device 2200 may not include one or more of the components illustrated in FIG. 11, but the RF device 2200 may include interface circuitry for coupling to the one or more components. For example, the RF device 2200 may not include an antenna 2202, but may include antenna interface circuitry (e.g., a matching circuitry, a connector and driver circuitry) to which an antenna 2202 may be coupled. In another set of examples, the RF device 2200 may not include a digital processing unit 2208 or a local oscillator 2206, but may include device interface circuitry (e.g., connectors and supporting circuitry) to which a digital processing unit 2208 or a local oscillator 2206 may be coupled.

As shown in FIG. 11, the RF device 2200 may include an antenna 2202, a duplexer 2204 (e.g., if the RF device 2200 is an FDD RF device; otherwise the duplexer 2204 may be omitted), a local oscillator 2206, a digital processing unit 2208. As also shown in FIG. 11, the RF device 2200 may include an RX path that may include an RX path amplifier 2212, an RX path pre-mix filter 2214, a RX path mixer 2216, an RX path post-mix filter 2218, and an analog-to-digital converter (ADC) 2220. As further shown in FIG. 11, the RF device 2200 may include a TX path that may include a TX path amplifier 2222, a TX path post-mix filter 2224, a TX path mixer 2226, a TX path pre-mix filter 2228, and a digital-to-analog converter (DAC) 2230. Still further, the RF device 2200 may further include an impedance tuner 2232, an RF switch 2234, and control logic 2236. In various embodiments, the RF device 2200 may include multiple instances of any of the components shown in FIG. 11. In some embodiments, the RX path amplifier 2212, the TX path amplifier 2222, the duplexer 2204, and the RF switch 2234 may be considered to form, or be a part of, an RF front-end (FE) of the RF device 2200. In some embodiments, the RX path amplifier 2212, the TX path amplifier 2222, the duplexer 2204, and the RF switch 2234 may be considered to form, or be a part of, an RF FE of the RF device 2200. In some embodiments, the RX path mixer 2216 and the TX path mixer 2226 (possibly with their associated pre-mix and post-mix filters shown in FIG. 11) may be considered to form, or be a part of, an RF transceiver of the RF device 2200 (or of an RF receiver or an RF transmitter if only RX path or TX path components, respectively, are included in the RF device 2200). In some embodiments, the RF device 2200 may further include one or more control logic elements/circuits, shown in FIG. 11 as control logic 2236, e.g., an RF FE control interface. In some embodiments, the control logic 2236 may be used to control other functions within the RF device 2200, e.g., enhance control of complex RF system environment, support implementation of envelope tracking techniques, reduce dissipated power, etc.

The antenna 2202 may be configured to wirelessly transmit and/or receive RF signals in accordance with any wireless standards or protocols, e.g., Wi-Fi, LTE, or GSM, as well as any other wireless protocols that are designated as 3G, 4G, 5G, and beyond. If the RF device 2200 is an FDD transceiver, the antenna 2202 may be configured for concurrent reception and transmission of communication signals in separate, i.e., non-overlapping and non-continuous, bands of frequencies, e.g., in bands having a separation of, e.g., 20 MHz from one another. If the RF device 2200 is a TDD transceiver, the antenna 2202 may be configured for sequential reception and transmission of communication signals in bands of frequencies that may be the same or overlapping for TX and RX paths. In some embodiments, the RF device 2200 may be a multi-band RF device, in which case the antenna 2202 may be configured for concurrent reception of signals having multiple RF components in separate frequency bands and/or configured for concurrent transmission of signals having multiple RF components in separate frequency bands. In such embodiments, the antenna 2202 may be a single wide-band antenna or a plurality of band-specific antennas (i.e., a plurality of antennas each configured to receive and/or transmit signals in a specific band of frequencies). In various embodiments, the antenna 2202 may include a plurality of antenna elements, e.g., a plurality of antenna elements forming a phased antenna array (i.e., a communication system or an array of antennas that may use a plurality of antenna elements and phase shifting to transmit and receive RF signals). Compared to a single-antenna system, a phased antenna array may offer advantages such as increased gain, ability of directional steering, and simultaneous communication. In some embodiments, the RF device 2200 may include more than one antenna 2202 to implement antenna diversity. In some such embodiments, the RF switch 2234 may be deployed to switch between different antennas.

An output of the antenna 2202 may be coupled to the input of the duplexer 2204. The duplexer 2204 may be any suitable component configured for filtering multiple signals to allow for bidirectional communication over a single path between the duplexer 2204 and the antenna 2202. The duplexer 2204 may be configured for providing RX signals to the RX path of the RF device 2200 and for receiving TX signals from the TX path of the RF device 2200.

The RF device 2200 may include one or more local oscillators 2206, configured to provide local oscillator signals that may be used for downconversion of the RF signals received by the antenna 2202 and/or upconversion of the signals to be transmitted by the antenna 2202.

The RF device 2200 may include the digital processing unit 2208, which may include one or more processing devices. The digital processing unit 2208 may be configured to perform various functions related to digital processing of the RX and/or TX signals. Examples of such functions include, but are not limited to, decimation/downsampling, error correction, digital downconversion or upconversion, DC offset cancellation, automatic gain control, etc. Although not shown in FIG. 11, in some embodiments, the RF device 2200 may further include a memory device, configured to cooperate with the digital processing unit 2208.

Turning to the details of the RX path that may be included in the RF device 2200, the RX path amplifier 2212 may include a low-noise amplifier (LNA). An input of the RX path amplifier 2212 may be coupled to an antenna port (not shown) of the antenna 2202, e.g., via the duplexer 2204. The RX path amplifier 2212 may amplify the RF signals received by the antenna 2202.

An output of the RX path amplifier 2212 may be coupled to an input of the RX path pre-mix filter 2214, which may be a harmonic or band-pass (e.g., low-pass) filter, configured to filter received RF signals that have been amplified by the RX path amplifier 2212.

An output of the RX path pre-mix filter 2214 may be coupled to an input of the RX path mixer 2216, also referred to as a downconverter. The RX path mixer 2216 may include two inputs and one output. A first input may be configured to receive the RX signals, which may be current signals, indicative of the signals received by the antenna 2202 (e.g., the first input may receive the output of the RX path pre-mix filter 2214). A second input may be configured to receive local oscillator signals from one of the local oscillators 2206. The RX path mixer 2216 may then mix the signals received at its two inputs to generate a downconverted RX signal, provided at an output of the RX path mixer 2216. As used herein, downconversion refers to a process of mixing a received RF signal with a local oscillator signal to generate a signal of a lower frequency. In particular, the TX path mixer (e.g., downconverter) 2216 may be configured to generate the sum and/or the difference frequency at the output port when two input frequencies are provided at the two input ports. In some embodiments, the RF device 2200 may implement a direct-conversion receiver (DCR), also known as homodyne, synchrodyne, or zero-IF receiver, in which case the RX path mixer 2216 may be configured to demodulate the incoming radio signals using local oscillator signals whose frequency is identical to, or very close to the carrier frequency of the radio signal. In other embodiments, the RF device 2200 may make use of downconversion to an intermediate frequency (IF). IFs may be used in superheterodyne radio receivers, in which a received RF signal is shifted to an IF before the final detection of the information in the received signal is done. Conversion to an IF may be useful for several reasons. For example, when several stages of filters are used, they can all be set to a fixed frequency, which makes them easier to build and to tune. In some embodiments, the RX path mixer 2216 may include several such stages of IF conversion.

Although a single RX path mixer 2216 is shown in the RX path of FIG. 11, in some embodiments, the RX path mixer 2216 may be implemented as a quadrature downconverter, in which case it would include a first RX path mixer and a second RX path mixer. The first RX path mixer may be configured for performing downconversion to generate an in-phase (I) downconverted RX signal by mixing the RX signal received by the antenna 2202 and an in-phase component of the local oscillator signal provided by the local oscillator 2206. The second RX path mixer may be configured for performing downconversion to generate a quadrature (Q) downconverted RX signal by mixing the RX signal received by the antenna 2202 and a quadrature component of the local oscillator signal provided by the local oscillator 2206 (the quadrature component is a component that is offset, in phase, from the in-phase component of the local oscillator signal by 90 degrees). The output of the first RX path mixer may be provided to a I-signal path, and the output of the second RX path mixer may be provided to a Q-signal path, which may be substantially 90 degrees out of phase with the I-signal path.

The output of the RX path mixer 2216 may, optionally, be coupled to the RX path post-mix filter 2218, which may be low-pass filters. In case the RX path mixer 2216 is a quadrature mixer that implements the first and second mixers as described above, the in-phase and quadrature components provided at the outputs of the first and second mixers respectively may be coupled to respective individual first and second RX path post-mix filters included in the filter 2218.

The ADC 2220 may be configured to convert the mixed RX signals from the RX path mixer 2216 from analog to digital domain. The ADC 2220 may be a quadrature ADC that, like the RX path quadrature mixer 2216, may include two ADCs, configured to digitize the downconverted RX path signals separated in in-phase and quadrature components. The output of the ADC 2220 may be provided to the digital processing unit 2208, configured to perform various functions related to digital processing of the RX signals so that information encoded in the RX signals can be extracted.

Turning to the details of the TX path that may be included in the RF device 2200, the digital signal to later be transmitted (TX signal) by the antenna 2202 may be provided, from the digital processing unit 2208, to the DAC 2230. Like the ADC 2220, the DAC 2230 may include two DACs, configured to convert, respectively, digital I- and Q-path TX signal components to analog form.

Optionally, the output of the DAC 2230 may be coupled to the TX path pre-mix filter 2228, which may be a band-pass (e.g., low-pass) filter (or a pair of band-pass, e.g., low-pass, filters, in case of quadrature processing) configured to filter out, from the analog TX signals output by the DAC 2230, the signal components outside of the desired band. The digital TX signals may then be provided to the TX path mixer 2226, which may also be referred to as an upconverter. Like the RX path mixer 2216, the TX path mixer 2226 may include a pair of TX path mixers, for in-phase and quadrature component mixing. Like the first and second RX path mixers that may be included in the RX path, each of the TX path mixers of the TX path mixer 2226 may include two inputs and one output. A first input may receive the TX signal components, converted to the analog form by the respective DAC 2230, which are to be upconverted to generate RF signals to be transmitted. The first TX path mixer may generate an in-phase (I) upconverted signal by mixing the TX signal component converted to analog form by the DAC 2230 with the in-phase component of the TX path local oscillator signal provided from the local oscillator 2206 (in various embodiments, the local oscillator 2206 may include a plurality of different local oscillators, or be configured to provide different local oscillator frequencies for the mixer 2216 in the RX path and the mixer 2226 in the TX path). The second TX path mixer may generate a quadrature phase (Q) upconverted signal by mixing the TX signal component converted to analog form by the DAC 2230 with the quadrature component of the TX path local oscillator signal. The output of the second TX path mixer may be added to the output of the first TX path mixer to create a real RF signal. A second input of each of the TX path mixers may be coupled the local oscillator 2206.

Optionally, the RF device 2200 may include the TX path post-mix filter 2224, configured to filter the output of the TX path mixer 2226.

In various embodiments, any of the RX path pre-mix filter 2214, the RX path post-mix filter 2218, the TX post-mix filter 2224, and the TX pre-mix filter 2228 may be implemented as RF filters. In some embodiments, an RF filter may be implemented as a plurality of RF filters, or a filter bank. A filter bank may include a plurality of RF filters that may be coupled to a switch, e.g., the RF switch 2234, configured to selectively switch any one of the plurality of RF filters on and off (e.g., activate any one of the plurality of RF filters), in order to achieve desired filtering characteristics of the filter bank (i.e., in order to program the filter bank). For example, such a filter bank may be used to switch between different RF frequency ranges when the RF device 2200 is, or is included in, a BS or in a UE device. In another example, such a filter bank may be programmable to suppress TX leakage on the different duplex distances.

The impedance tuner 2232 may include any suitable circuitry, configured to match the input and output impedances of the different RF circuitries to minimize signal losses in the RF device 2200. For example, the impedance tuner 2232 may include an antenna impedance tuner. Being able to tune the impedance of the antenna 2202 may be particularly advantageous because antenna's impedance is a function of the environment that the RF device 2200 is in, e.g., antenna's impedance changes depending on, e.g., if the antenna is held in a hand, placed on a car roof, etc.

As described above, the RF switch 2234 may be a device configured to route high-frequency signals through transmission paths, e.g., in order to selectively switch between a plurality of instances of any one of the components shown in FIG. 11, e.g., to achieve desired behavior and characteristics of the RF device 2200. For example, in some embodiments, an RF switch may be used to switch between different antennas 2202. In other embodiments, an RF switch may be used to switch between a plurality of RF filters (e.g., by selectively switching RF filters on and off) of the RF device 2200. Typically, an RF system would include a plurality of such RF switches.

The RF device 2200 provides a simplified version and, in further embodiments, other components not specifically shown in FIG. 11 may be included. For example, the RX path of the RF device 2200 may include a current-to-voltage amplifier between the RX path mixer 2216 and the ADC 2220, which may be configured to amplify and convert the downconverted signals to voltage signals. In another example, the RX path of the RF device 2200 may include a balun transformer for generating balanced signals. In yet another example, the RF device 2200 may further include a clock generator, which may, e.g., include a suitable phased-lock loop (PLL), configured to receive a reference clock signal and use it to generate a different clock signal that may then be used for timing the operation of the ADC 2220, the DAC 2230, and/or that may also be used by the local oscillator 2206 to generate the local oscillator signals to be used in the RX path or the TX path. In general, RF device 2200 may include clock generation circuitries or PLL in various domains such as in a RF domain, a digital I/O domain (e.g., for communications with devices outside of the RF device), clock domain, etc. In some embodiments, the clock generator or PLL may be similar to the frequency synthesizer 100 discussed above with reference to FIG. 1. In some embodiments, the clock generator or PLL may utilize fractional frequency dividers similar to the duty cycle-regulated, balanced fractional frequency divider circuitry 400 discussed above with reference to FIGS. 4-9 to provide clock signals with a low subharmonic distortion and a 50% duty cycle.

EXAMPLES

In Example 1 includes an apparatus including frequency divider circuitry including a first node to receive an input signal; fractional divider circuitry to generate, based on the input signal and a frequency-division ratio, a first signal having a first series of pulses with adjacent pulses triggered by opposite edges of the input signal, where the fractional divider circuitry includes first signal selection circuitry; balancer divider circuitry to generate, based on the input signal, a second signal having a second series of pulses aligned to the first series of pulses, where the balancer divider circuitry includes second signal selection circuitry triggered by opposite edges of the input signal than the first signal selection circuitry; and a second node to combine the first signal and the second signal.

In Example 2, the apparatus of Example 1 can optionally include the balancer divider circuitry generates the second signal using the same frequency-division ratio as the fractional divider circuitry.

In Example 3, the apparatus of any of Examples 1-2 can optionally include the frequency-division ratio is 1.5.

In Example 4, the apparatus of any of Examples 1-3 can optionally include each of the first signal selection circuitry and the second signal selection circuitry has a respective first input, a respective second input, and a respective output; the first signal selection circuitry switches from selecting the first respective input to selecting the second respective input responsive to one of a first rising edge or a first falling edge of the input signal; and the second signal selection circuitry switches from selecting the respective first input to selecting the respective second input responsive to the other one of the first rising edge or the first falling edge of the input signal.

In Example 5, the apparatus of any of Examples 1-4 can optionally include the first signal selection circuitry and the second signal selection circuitry have the same circuit topology.

In Example 6, tlhe apparatus of any of Examples 1-5 can optionally include the fractional divider circuitry further includes first dual edge-triggered circuitry to generate a third signal and a fourth signal responsive respectively to the first falling edge and the first rising edge of the input signal, third signal and the fourth signal received respectively at the respective first input and the respective second input of the first signal selection circuitry; and the balancer divider circuitry further includes second dual edge-triggered circuitry to generate a fifth signal and a sixth signal responsive respectively to the first rising edge and the first falling edge of the input signal, the fifth signal and the sixth signal received respectively at the respective first input and the respective second input of the second signal selection circuitry.

In Example 7, the apparatus of any of Examples 1-6 can optionally include the fractional divider circuitry further includes feedback circuitry to generate a feedback signal based on the combined first signal and second signal; the fractional divider circuitry generates the first signal further based on the feedback signal; and the balancer divider circuitry generates the second signal further based on the feedback signal.

In Example 8, the apparatus of any of Examples 1-7 can optionally include the frequency divider circuitry further includes duty cycle correction circuitry to adjust a duty cycle of the combined first signal and second signal based on a feedback indicative of duty information of the combined first signal and second signal and a target duty cycle.

In Example 9, the apparatus of any of Examples 1-8 can optionally include a phased-locked loop (PLL) including a voltage-controlled oscillator (VCO) to output a VCO signal; and the frequency divider circuitry coupled to the VCO, where the input signal corresponds to the VCO output signal.

In Example 10, the apparatus of any of Examples 1-9 can optionally include the PLL further includes third signal selection circuitry to select between the VCO output signal or an output signal of the frequency divider circuitry.

In Example 11, the apparatus of any of Examples 1-10 can optionally include the apparatus is a radio transceiver integrated circuit.

Example 12 includes an apparatus including frequency divider circuitry including an input node to receive an input signal; fractional divider circuitry to generate a frequency-divided signal from the input signal, where adjacent pulses in the frequency-divided signal are triggered by opposite edges of the input signal; and duty cycle correction delay-locked loop (DLL) to adjust a duty cycle of the frequency-divided signal.

In Example 13, the apparatus of Example 12 can optionally include the duty cycle DLL generates a rising edge of a duty cycle-adjusted signal from a rising edge of the frequency-divided signal; and generates a falling edge of the duty cycle-adjusted signal based on an error signal indicative of duty cycle information of the frequency-divided signal.

In Example 14, the apparatus of any of Examples 12-13 can optionally include the duty cycle DLL includes a filter to output a direct current (DC) component of the frequency-divided signal; and an amplifier having a first input to receive the DC component of the frequency-divided signal; a second input to receive a reference voltage; and an output to output the error signal; and a variable delay line controlled by the error signal to generate a feedback signal.

In Example 15, the apparatus of any of Examples 12-14 can optionally include the reference voltage at the second input of the amplifier is half of a supply voltage.

In Example 16, the apparatus of any of Examples 12-15 can optionally include the reference voltage at the second input of the amplifier is configured based on the target duty cycle.

In Example 17, the apparatus of any of Examples 12-16 can optionally include the duty cycle correction DLL generates the falling edge of the duty cycle-adjusted signal further from a rising edge of the feedback signal.

In Example 18, the apparatus of any of Examples 12-16 can optionally include the duty cycle DLL generates the falling edge of the duty cycle-adjusted signal further by gating a falling edge of the frequency-divided signal by the feedback signal.

In Example 19, the apparatus of any of Examples 12-18 can optionally include balancer divider circuitry to generate a first signal having a same phase as the frequency-divided signal, where the balancer divider circuitry includes a first multiplexer that is triggered by opposite edges of the input signal than a second multiplexer in the fractional divider circuitry; and a summing node to add the first signal to the frequency-divided signal.

In Example 20, the apparatus of any of Examples 12-19 can optionally include a phase-locked loop (PLL) including a voltage-controlled oscillator (VCO); and the frequency divider circuitry coupled to the VCO.

In Example 21, the apparatus of any of Examples 12-20 can optionally include integer divider circuitry to divide the duty cycle-adjusted signal by a power of 2.

In Example 22, the apparatus of any of Examples 12-21 can optionally include the apparatus is a radio transceiver integrated circuit.

Example 23 includes an integrated circuit device including frequency synthesizer circuitry including a voltage-controlled oscillator (VCO) to generate a reference clock signal; frequency divider circuitry to divide a frequency of the reference clock signal by a fractional division ratio to generate a first signal; and subharmonic cancellation circuitry to generate a second signal having the same phase as the first signal; and combine the first signal and the second signal to generate a third signal having a reduced subharmonic than the first signal, where the subharmonic cancellation circuitry includes a replica circuit replicating a first circuit of the frequency divider circuitry, where the replica circuit is triggered by opposite edges of the reference clock signal than the first circuit; and duty cycle correction circuitry to adjust a duty cycle of the third signal to generate a duty cycle-corrected signal.

In Example 24, the integrated circuit device of Example 23 can optionally include the first circuit of the frequency divider circuitry includes a first multiplexer; the replica circuit of the subharmonic cancellation circuitry includes a second multiplexer; each of the first multiplexer and the second multiplexer has a respective first input, a respective second input, and a respective output; the first multiplexer switches from selecting the first respective input to selecting the second respective input responsive to one of a rising edge or a falling edge of the reference clock signal; and the second multiplexer switches from selecting the respective first input to selecting the respective second input responsive to the other one of the rising edge or the falling edge of the reference clock signal.

In Example 25, the integrated circuit device of any of Examples 23-24 can optionally include the duty cycle correction circuitry adjusts the duty cycle of the third signal by generating a rising edge of the duty cycle-corrected signal from a rising edge of the third signal; generating a falling edge the duty cycle-corrected signal from a rising edge of a feedback signal; and generating the feedback signal by delaying the third signal by a delay associated with a duty cycle of the third signal.

In Example 26, the integrated circuit device of any of Examples 23-24 can optionally include the duty cycle correction circuitry adjusts the duty cycle of the third signal by generating a rising edge of the duty cycle-corrected signal from a rising edge of the third signal; generating a falling edge the duty cycle-corrected signal by gating a falling edge of the third signal by a rising edge of a feedback signal; and generating the feedback signal by delaying the third signal by a delay associated with a duty cycle of the third signal.

In Example 27, the integrated circuit device of any of Examples 23-27 can optionally include radio frequency (RF) circuitry to generate an RF signal based on the third signal.

In Example 28, the integrated circuit device of claim 23 can optionally include analog-to-digital conversion (ADC) circuitry to sample a signal based on the third signal.

In Example 29, the integrated circuit device of any of Examples 23-28 can optionally include digital input/output (IO) circuitry to generate a digital signal based on the duty cycle-corrected signal.

Variations and Implementations

While embodiments of the present disclosure were described above with references to exemplary implementations as shown in FIGS. 1-10, a person skilled in the art will realize that the various teachings described above are applicable to a large variety of other implementations.

In certain contexts, the features discussed herein can be applicable to automotive systems, safety-critical industrial applications, medical systems, scientific instrumentation, wireless and wired communications, radio, radar, industrial process control, audio and video equipment, current sensing, instrumentation (which can be highly precise), and other digital-processing-based systems.

In the discussions of the embodiments above, components of a system, such as filters, converters, mixers, amplifiers, digital logic circuitries, and/or other components can readily be replaced, substituted, or otherwise modified in order to accommodate particular circuitry needs. Moreover, it should be noted that the use of complementary electronic devices, hardware, software, etc., offer an equally viable option for implementing the teachings of the present disclosure related to fractional frequency dividers, in various communication systems.

Parts of various systems for implementing duty cycle-regulated, balanced fractional frequency divider as proposed herein can include electronic circuitry to perform the functions described herein. In some cases, one or more parts of the system can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed-signal domain. In some instances, the processor may be configured to carrying out the functions described herein by executing one or more instructions stored on a non-transitory computer-readable storage medium.

In one example embodiment, any number of electrical circuits of the present figures may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of DSPs, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the present figures may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often RF functions: all of which may be provided on a single chip substrate. Other embodiments may include a multi-chip-module (MCM), with a plurality of separate ICs located within a single electronic package and configured to interact closely with each other through the electronic package.

It is also imperative to note that all of the specifications, dimensions, and relationships outlined herein (e.g., the number of components of the apparatuses and/or RF device shown in FIGS. 1-2, 4-5, 7, and 9-10) have only been offered for purposes of example and teaching only. Such information may be varied considerably without departing from the spirit of the present disclosure, or the scope of the appended claims. It should be appreciated that the system can be consolidated in any suitable manner. Along similar design alternatives, any of the illustrated circuits, components, modules, and elements of the present figures may be combined in various possible configurations, all of which are clearly within the broad scope of this specification. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments. Also, as used herein, including in the claims, "or" as used in a list of items (for example, a list of items prefaced by a phrase such as "at least one of" or "one or more of") indicates an inclusive list such that, for example, a list of [at least one of A, B, or C] means A or B or C or AB or AC or BC or ABC (i.e., A and B and C).

Various aspects of the illustrative embodiments are described using terms commonly employed by those skilled in the art to convey the substance of their work to others skilled in the art. For example, the term "connected" means a direct electrical connection between the things that are connected, without any intermediary devices/components, while the term "coupled" means either a direct electrical connection between the things that are connected, or an indirect connection through one or more passive or active intermediary devices/components. In another example, the term "circuit" means one or more passive and/or active components that are arranged to cooperate with one another to provide a desired function. Also, as used herein, the terms "substantially," "approximately," "about," etc., may be used to generally refer to being within +/−20% of a target value, e.g., within +/−10% of a target value, based on the context of a particular value as described herein or as known in the art.

Numerous other changes, substitutions, variations, alterations, and modifications may be ascertained to one skilled in the art and it is intended that the present disclosure encompass all such changes, substitutions, variations, alterations, and modifications as falling within the scope of the examples and appended claims. Note that all optional features of the apparatus described above may also be implemented with respect to the method or process described herein and specifics in the examples may be used anywhere in one or more embodiments.

What is claimed is:

1. A device, comprising:
    duty cycle correction circuitry configured to generate, based on an input signal, an output signal having a target duty cycle, the duty cycle correction circuitry comprising:
        first circuitry configured to generate a rising edge of the output signal from a rising edge of the input signal, and further configured to generate a falling edge of the output signal based on a feedback signal representative of duty cycle information of the output signal, the first circuitry comprising a first inverter configured to receive the input signal and a second inverter configured to receive the feedback signal.

2. The device of claim 1, wherein the first circuitry further comprises a set-reset latch including a first NAND gate and a second NAND gate, and wherein the first NAND gate is coupled with the first inverter and the second NAND gate is coupled with the second inverter.

3. The device of claim 2, wherein the duty cycle correction circuitry further comprises second circuitry including:
    a filter configured to output a direct current (DC) component of the output signal;
    an amplifier device including:
        a first input configured to receive the DC component;
        a second input configured to receive a reference voltage; and
        an output configured to supply an error signal corresponding to a difference between the DC component and the reference voltage; and
    a variable delay line controlled by the error signal to generate the feedback signal.

4. The device of claim 3, wherein the reference voltage determines the target duty cycle.

5. The device of claim 3, wherein the reference voltage is half of a supply voltage and causes the target duty cycle to be 50% of a duty cycle of the input signal.

6. The device of claim 3, wherein to generate the falling edge of the output signal based on the feedback signal the first circuitry is further configured to generate the falling edge of the output signal from a rising edge of the feedback signal.

7. The device of claim 6, further comprising third circuitry configured to generate the input signal according to a frequency-division ratio, wherein adjacent pulses in the input signal are triggered by opposite edges of a reference signal, resulting in the input signal having a frequency that is equal to a second frequency of the reference signal multiplied by the frequency-division ratio.

8. The device of claim 7, wherein the frequency-division ratio is equal to 1.5.

9. A device, comprising:
a pulse generator configured to,
receive an input signal;
generate a rising edge of an output signal from a rising edge of the input signal; and
generate a falling edge of the output signal based on a feedback signal representative of duty cycle information of the output signal,
wherein the output signal has a target duty cycle.

10. The device of claim 9, wherein the pulse generator comprises:
a set-reset latch including a first NAND gate and a second NAND gate;
a first inverter coupled with the first NAND gate and configured to receive the input signal; and
a second inverter coupled with the second NAND gate and configured to receive the feedback signal.

11. The device of claim 10, further comprising a delay-locked loop (DLL) coupled with the pulse generator, the DLL including:
a filter configured to output a direct current (DC) component of the output signal;
an amplifier device including:
a first input configured to receive the DC component;
a second input configured to receive a reference voltage; and
an output configured to supply an error signal corresponding to a difference between the DC component and the reference voltage; and
a variable delay line controlled by the error signal to generate the feedback signal.

12. The device of claim 11, wherein the reference voltage determines the target duty cycle.

13. The device of claim 11, wherein the reference voltage is half of a supply voltage and causes the target duty cycle to be 50% of a duty cycle of the input signal.

14. The device of claim 11, wherein to generate the falling edge of the output signal based on the feedback signal the pulse generator is further configured to generate the falling edge of the output signal from a rising edge of the feedback signal.

15. The device of claim 14, further comprising circuitry configured to generate the input signal according to a frequency-division ratio, wherein adjacent pulses in the input signal are triggered by opposite edges of a reference signal, resulting in the input signal having a frequency that is equal to a second frequency of the reference signal multiplied by the frequency-division ratio.

16. The device of claim 15, wherein the frequency-division ratio is equal to 1.5.

17. A method, comprising:
receiving, by pulse generator circuitry, an input signal; and
generating, by the pulse generator circuitry, based on the input signal, an output signal having a target duty cycle, wherein the generating comprises:
generating a rising edge of the output signal from a rising edge of the input signal; and
generating a falling edge of the output signal based on a feedback signal representative of duty cycle information of the output signal.

18. The method of claim 17, wherein the pulse generator circuitry comprises:
a set-reset latch including a first NAND gate and a second NAND gate;
a first inverter coupled with the first NAND gate and configured to receive the input signal; and
a second inverter coupled with the second NAND gate and configured to receive the feedback signal.

19. The method of claim 18, further comprising:
outputting, by a filter of a delay-locked loop (DLL) coupled with the pulse generator circuitry, a direct current (DC) component of the output signal;
receiving, by an amplifier of the DLL, the DC component;
receiving, by the amplifier, a reference voltage;
supplying, by the amplifier, an error signal corresponding to a difference between the DC component and the reference voltage; and
generating, by a variable delay line of the DLL, using the error signal, the feedback signal.

20. The method of claim 19, wherein the reference voltage is half of a supply voltage and causes the target duty cycle to be 50% of a duty cycle of the input signal.

* * * * *